United States Patent
Iihara et al.

(10) Patent No.: US 8,617,793 B2
(45) Date of Patent: Dec. 31, 2013

(54) WATERLESS PLANOGRAPHIC PRINTING PLATE PRECURSOR

(75) Inventors: Akihiro Iihara, Shiga (JP); Mitsuru Suezawa, Shiga (JP); Masuichi Eguchi, Shiga (JP)

(73) Assignee: Toray Industries, Inc. (JP)

( * ) Notice: Subject to any disclaimer, the term of this patent is extended or adjusted under 35 U.S.C. 154(b) by 382 days.

(21) Appl. No.: 12/513,513

(22) PCT Filed: Nov. 1, 2007

(86) PCT No.: PCT/JP2007/071283
§ 371 (c)(1),
(2), (4) Date: May 5, 2009

(87) PCT Pub. No.: WO2008/056588
PCT Pub. Date: May 15, 2008

(65) Prior Publication Data
US 2010/0075250 A1    Mar. 25, 2010

(30) Foreign Application Priority Data

Nov. 6, 2006 (JP) ................................ 2006-299899
Mar. 19, 2007 (JP) ................................ 2007-070329
Aug. 30, 2007 (JP) ................................ 2007-223693

(51) Int. Cl.
*G03F 7/00* (2006.01)

(52) U.S. Cl.
USPC .................................... 430/272.1; 430/270.1

(58) Field of Classification Search
USPC ................. 430/270.1, 272.1; 101/450–463.1
See application file for complete search history.

(56) References Cited

U.S. PATENT DOCUMENTS

| | | | | |
|---|---|---|---|---|
| 3,869,285 | A * | 3/1975 | Kondo et al. ................ | 430/49.2 |
| 5,212,048 | A * | 5/1993 | Lewis et al. ................ | 430/272.1 |
| 5,958,652 | A | 9/1999 | Suezawa et al. | |
| 6,096,476 | A | 8/2000 | Yanagida et al. | |
| 6,416,932 | B1 * | 7/2002 | Ray et al. ................... | 430/303 |
| 6,730,457 | B2 * | 5/2004 | Saraiya et al. .............. | 430/273.1 |
| 2004/0180290 | A1 * | 9/2004 | Mori ............................ | 430/300 |
| 2007/0236776 | A1 * | 10/2007 | Ohuchi et al. .............. | 359/296 |

FOREIGN PATENT DOCUMENTS

| | | |
|---|---|---|
| DE | 42 33 049 A1 | 4/1993 |
| EP | 0 684 133 A1 | 11/1995 |
| GB | 1 451 378 A | 9/1976 |
| JP | 55-055343 A | 4/1980 |
| JP | 63-179361 A | 7/1988 |
| JP | 2-063050 A | 3/1990 |
| JP | 2-063051 A | 3/1990 |
| JP | 4-002265 A | 1/1992 |
| JP | 4-163557 A | 6/1992 |
| JP | 4-343360 A | 11/1992 |
| JP | 5-002272 A | 1/1993 |
| JP | 5-006000 A | 1/1993 |
| JP | 6-118629 A | 4/1994 |
| JP | 7-314934 A | 12/1995 |
| JP | 7-325389 A | 12/1995 |
| JP | 9-034132 A | 2/1997 |
| JP | 9-086065 A | 3/1997 |
| JP | 10-039497 A | 2/1998 |
| JP | 11-157236 A | 6/1999 |
| JP | 11-221977 A | 8/1999 |
| JP | 11-240271 A | 9/1999 |
| JP | 11-352672 A | 12/1999 |
| JP | 2001-105760 A | 4/2001 |
| JP | 2001-324820 A | 11/2001 |
| JP | 2002-244279 A | 8/2002 |
| JP | 2004-199016 A | 7/2004 |
| JP | 2005-300586 A | 10/2005 |
| JP | 3716429 B2 | 11/2005 |
| JP | 2008170665 A * | 7/2008 |

* cited by examiner

*Primary Examiner* — Cynthia H Kelly
*Assistant Examiner* — Connie P Johnson
(74) *Attorney, Agent, or Firm* — DLA Piper LLP (US)

(57) ABSTRACT

A waterless planographic printing plate precursor is capable of plate inspection without a post-dyeing step, capable of being handled in a light room and excellent in coloring matter fixing in silicone rubber layer. The waterless planographic printing plate precursor has at least a photosensitive layer or heat sensitive layer and a silicone rubber layer on a substrate, which is a waterless planographic printing plate precursor characterized in that a color pigment is contained in the above-mentioned silicone rubber layer, and it is possible to obtain a more excellent effect by further incorporating, in the above-mentioned silicone rubber layer, a pigment dispersant containing an organic complex compound comprising of a metal and an organic compound. Furthermore, when aluminum and/or titanium is contained as the above-mentioned metal, a more excellent effect can be obtained.

2 Claims, No Drawings

WATERLESS PLANOGRAPHIC PRINTING PLATE PRECURSOR

RELATED APPLICATIONS

This is a §371 of International Application No. PCT/JP2007/071283, with an international filing date of Nov. 1, 2007 (WO 2008/056588 A1, published May 15, 2008), which is based on Japanese Patent Application Nos. 2006-299899, filed Nov. 6, 2006, 2007-070329, filed Mar. 19, 2007, and 2007-223693, filed Aug. 30, 2007.

TECHNICAL FIELD

This disclosure relates to a waterless planographic printing plate precursor capable of printing without using dampening water.

BACKGROUND

So far, various printing, plates for carrying out a planographic printing without using dampening water (hereafter, referred to as "waterless planographic printing"), in which a silicone rubber or fluororesin is used as ink repellent layer are proposed. The waterless planographic printing is a planographic printing method in which an image area and a non-image area are prepared in almost the same plane, and after depositing ink only on the image area by taking advantage of difference of ink depositability between the image area as ink receiving layer, and the non-image area as ink repellent layer, and printing is carried out by transferring the ink to a subject to be printed such as paper, and characterized by capability of printing without using dampening water.

As exposure method of the waterless planographic printing plate precursor, various methods are proposed, but it is roughly classified in system in which UV irradiation is carried out via an original image film, and computer-to-plate (CTP) system in which an image is directly written from a copy without using the original image film. As the CTP system, a method in which a laser light is irradiated, a method of writing by a thermal head, a method in which an electric voltage is partially charged by a pin electrode, a method in which ink repellent layer or ink receiving layer is formed by an ink jet, etc., are mentioned, but the method of using a laser light is more excellent than the other systems in view of resolution and printing plate making speed.

Furthermore, the waterless planographic printing plate precursor is roughly classified into photo(heat)sensitive layer removing type in which the photo(heat)sensitive layer is removed in exposure step or developing step and photo(heat) sensitive layer leaving type in which the photo(heat)sensitive layer is left even after the exposure step and developing step. Since the photo(heat)sensitive layer is removed in the photo (heat)sensitive layer removing type, by incorporating a coloring matter in the photo(heat)sensitive layer, it is possible to make a contrast between the image area and the non-image area. Accordingly, it has a merit that a plate inspection can be carried out even without a post-dyeing step. However, since cell depth which forms the image area is deep, a much amount of ink is needed at the time of printing. Since it is necessary to remove the photo(heat)sensitive layer in the depth direction, there is a problem that a fine image is hard to be reproduced.

On the other hand, a heat sensitive layer leaving type waterless CTP planographic printing plate precursor which has at least a heat sensitive layer and a silicone rubber layer on a substrate is proposed. In these printing plate precursors, since heat sensitive layer material is left in the laser irradiated portion also after the development, the amount of ink used at printing is small, and reproducibility of a fine image is also good. Since it can be exposed by a low laser output, not only advantageous in view points of running cost and laser life, but also a specific suction device becomes unnecessary, since abrasion sludge is not generated at the laser irradiation. However, since the heat sensitive layer leaves in both of the laser irradiated portion and the non-irradiated portion, it was difficult to make a color contrast of the laser irradiated portion and the non-irradiated portion, and a plate inspection was difficult.

In the production method of planographic printing plate by using the heat sensitive layer leaving type waterless CTP planographic printing plate precursor, a method having a step of dyeing the plate is proposed. In this method, although a plate inspection of the printing plate after dyeing the image area becomes possible, since an additional dyeing step becomes necessary, there were problems in handling a dyeing liquid, an upsizing of developing machine, cost, etc.

To this problem, a waterless planographic printing plate precursor containing a photofading material or photocoloring material in the silicone rubber layer and a waterless CTP planographic printing plate precursor containing a dye in the silicone rubber layer (for example, refer to JP 2002-244279 A (claims)) are proposed. These printing plate precursors can be inspected without the post-dyeing step. However, there was a problem that the plate having photofading material or photocoloring material cannot be handled in a light room. On the other hand, in the plate containing a dye, there were problems in coloring matter fixation in silicone rubber layer such that the dye in the silicone rubber layer causes an intralayer aggregation with a lapse of time, or the dye is concentrated in the heat sensitive layer interface of a higher polarity, or in the case where the silicone rubber layer has a protective film, said protective film absorbs the dye. Accordingly, there were cases in which the printing plate inspectability lowers, or an adhesion strength decrease between the silicone rubber layers and the heat sensitive layers due to the dye concentration. In addition, there are also cases in which the colored dye is extracted by various organic chemical liquids used for development or by a solvent in the ink used at the time of printing, and the printing plate inspectability lowers or a chemical liquid for development or the ink were contaminated with the extracted dye in some cases.

It could therefor be helpful to provide, in view of the above-mentioned problems, a waterless planographic printing plate precursor capable of a plate inspection without a post-dyeing step, capable of being handled in a light room and excellent in coloring matter fixing in the silicone rubber layer.

SUMMARY

We thus provide a waterless planographic printing plate precursor having at least a photosensitive layer or heat sensitive layer and a silicone rubber layer on a substrate, which is a waterless planographic printing plate precursor characterized in that a color pigment is contained in the above-mentioned silicone rubber layer.

The waterless planographic printing plate precursor capable of a plate inspection without a post-dyeing step, capable of being handled in a light room and excellent in coloring matter fixing in silicone rubber layer, can be obtained.

DETAILED DESCRIPTION

The waterless planographic printing plate precursor is characterized by having at least a photosensitive layer or heat sensitive layer and a silicone rubber layer on a substrate and containing a color pigment in the above-mentioned silicone rubber layer. Here, the color pigment is a pigment which absorbs any light in the visible light wavelength region (380 to 780 nm).

It is important that the pigment is contained in the silicone rubber layer. In general, since pigment is insoluble in water or an organic solvent such as aliphatic hydrocarbons, by containing a pigment, compared to cases in which a dye which is soluble in water or an organic solvent, an extraction of coloring matter by water or an organic chemical liquid used in developing step, or by a solvent in ink or various cleaning agents, etc. used in printing step, is significantly prevented.

The color pigment is classified in colored inorganic pigment and colored organic pigment. As the colored inorganic pigment, for example, oxides such as red iron oxide (ferric oxide), chromium oxide, cobalt blue, black iron oxide or complex oxide thereof, hydroxides such as yellow iron oxide or viridian, sulfide selenides such as vermilion, cadmium yellow or cadmium red, ferrocyanides such as milori blue, chromates such as chrome yellow, zinc chromate, molybdenum red or strontium chromate, silicates such as hydrated silicate, ultramarine or garnet, phosphates such as manganese violet, and carbon black, etc. are mentioned. As the colored organic pigment, for example, pigments for print prepared by dyeing a body pigment (barite powder, precipitated barium sulfate, barium carbonate, calcium carbonate powder, precipitated calcium carbonate, gypsum, asbestos, clay, silica powder, diatomite, talc, basic magnesium carbonate, alumina white, etc.) with a dye, azo-based pigments, phthalocyanine pigments, condensed polycyclic pigments, nitro-based pigments, nitroso-based pigments, alkali blue or aniline black, etc., are mentioned. As dyes which are material for pigment for print, basic dyes such as Rhodamine or Methyl Violet, acidic dyes such as Quinoline Yellow, Peacock Blue or Alkali Blue, vat dyes such as Malachite Green, mordant dyes such as Alizarin, are mentioned. As concrete examples of the azo-based pigment, soluble azos such as Lithol Red, Lake Red C, Brilliant Carmine 6B, Watchyoung Red or Bordeaux 10B, insoluble azos such as Fast Yellow, Disazo Yellow, Pyrazolone Orange, Para Red, Lake Red 4R or Naphthol Red, condensed azos such as Chromophthal Yellow 3G or Chromophthal Scarlet RN, azo complex salts such as Nickel Azo Yellow, benzimidazolone azos such as Permanent Orange HL, are mentioned. As concrete examples of the phthalocyanine pigment, Phthalocyanine Blue, Fast Sky Blue, Phthalocyanine Green, etc. are mentioned. As concrete examples of condensed polycyclic pigment, anthraquinone-based pigments, threne-based pigments such as Anthrapyrimidine Yellow, Perinone Orange, Perylene Red, Thioindigo Red or Indanthrone Blue, quinacridone-based pigments such as Quinacridone Red or Quinacridone Violet, dioxazine-based pigments such as Dioxazine Violet, isoindolinon-based pigments such as Isoindolinon Yellow, etc., are mentioned. As nitro-based, pigments, Naphthol Yellow S or the like, as nitroso-based pigments, Naphthol Green B or the like are mentioned.

It is important that a printing plate inspectability of the waterless planographic printing plate after the exposure and development is good. As the printing plate inspectability of the waterless planographic printing plate, other than the visual printing plate inspectability by a visual inspection, it is necessary that instrumental printing plate inspectability by a tone value measuring instrument is good. In general, since an instrumental plate inspection is severer than a visual plate inspection, a waterless planographic printing plate which is good in instrumental plate inspection is also good in visual plate inspection in most cases.

In an ordinary tone value measuring instrument, any one of a blue light (wavelength 400 to 500 nm), a green light (wavelength 500 to 600 nm), a red light (wavelength 600 to 700 nm), or a white light (wavelength 400 to 700 nm) is irradiated on a halftone dot portion formed on a printing plate, and a tone value is calculated from a difference between reflected light intensities of the image area and the non-image area. In the case where the difference of reflected light intensities between the image area and the non-image area is large, a good measurement of the tone value is possible, but in the case where there is a small or no difference of reflected light intensities between the image area and the non-image area, a good measurement of the tone value is impossible. Since most of organic compound which constitutes primer layer or photo(heat)sensitive layer of the waterless planographic printing plate precursor absorb blue light, when the silicone rubber layer is colored with a color pigment such as of yellow or orange which absorbs the blue light, a difference of reflected light intensities between the image area and the non-image area becomes small, and the measurement of the tone value becomes worse in some cases. When a silicone rubber layer colored with a color pigment such as of yellow or orange which absorbs the blue light, printing plate inspectability by a visual inspection is also difficult in some cases. For such a reason, it is preferable to use a color pigment which absorbs the green light or red light in view of instrumental printing plate inspectability or visual printing plate inspectability. Among the above-mentioned color pigments, as the color pigment which absorbs green light or red light, red iron oxide (ferric oxide), chromium oxide, cobalt blue, black iron oxide, viridian, vermilion, cadmium red, milori blue, molybdenum red, hydrated silicate, ultramarine, garnet, manganese violet, carbon black, pigments for print in which a body pigment is dyed with a dye such as Rhodamine, Methyl Violet, Peacock Blue, Alkali Blue, Malachite Green or Alizarin, and, Alkali Blue, Aniline Black, Lithol Red, Lake Red C, Brilliant Carmine 6B, Watchyoung Red, Bordeaux 10B, Para Red, Lake Red 4R, Naphthol Red, Chromophthal Scarlet RN, Phthalocyanine Blue, Fast Sky Blue, Phthalocyanine Green, Anthraquinone-based pigments, Perylene Red, Thioindigo Red, Indanthrone Blue, Quinacridone Red, Quinacridone Violet, Dioxazine Violet and Naphthol Green B, are mentioned. Furthermore, among these color pigments which absorb the green light or red light, it is preferable to use a color pigment of which density is 3 $g/cm^3$ or less, in view of preventing precipitation of the color pigment in silicone liquid or diluted silicone liquid. Among the above-mentioned color pigments which absorb green light or red light, as color pigments of which density is 3 $g/cm^3$ or less, cobalt blue, milori blue, hydrated silicate, ultramarine, carbon black, printing pigments in which a body pigment (calcium carbonate powder, precipitated calcium carbonate, gypsum, asbestos, clay, silica powder, diatomite, talc, basic magnesium carbonate, alumina white) is dyed with a dye such as Rhodamine, Methyl Violet, Peacock Blue, Alkali Blue, Malachite Green or Alizarin, and, Alkali Blue, Aniline Black, Lithol Red, Lake Red C, Brilliant Carmine 6B, Watchyoung Red, Bordeaux 10B, Para Red, Lake Red 4R, Naphthol Red, Chromophthal scarlet RN, Phthalocyanine Blue, Fast Sky Blue, Phthalocyanine Green, anthraquinone-based pigments, Perylene Red, Thioindigo Red, Indanthrone Blue, Quinacridone Red, Quinacridone Violet, Dioxazine Violet, Naphthol Green B, are mentioned.

In the waterless planographic printing plate precursor, it is preferable that a content of color pigment is 0.1 vol % or more in the silicone rubber layer, and 0.2 vol % or more is more preferable. In view of maintaining ink repellency of the silicone rubber layer, 20 vol % or less is preferable, and 10 vol % or less is more preferable.

In the waterless planographic printing plate precursor, the silicone rubber layer may be any one of an addition reaction type or condensation reaction type.

The addition reaction type silicone rubber layer is made from a composition which contains at least a vinyl group-containing organopolysiloxane, an SiH group-containing compound (addition reaction type cross-linking agent), a reaction inhibitor and a curing catalyst (hereafter, referred to as the silicone liquid).

The vinyl group-containing organopolysiloxane has a structure expressed by the following general formula (I), and has a vinyl group at its main chain end or in the main chain. Among them, those having vinyl group at its main chain end is preferable.

$$—(SiR^1R^2—O—)_n—\qquad(I)$$

In the formula, n denotes an integer of 2 or more and $R^1$ and $R^2$ may be the same or different, and denote a saturated or unsaturated hydrocarbon group having a carbon number of 1 to 50. The hydrocarbon group may be linear or branched or cyclic and may contain an aromatic ring.

In the above-mentioned formula, it is preferable that 50% or more of the entire $R^1$ and $R^2$ is methyl group in view of ink repellency of the printing plate. In view of its handling properties or ink repellency of the printing plate, or scratch resistance, it is preferable that a weight average molecular weight of the vinyl group-containing organopolysiloxane is 10,000 to 600,000.

As the SiH group-containing compound, for example, organohydrogen polysiloxane and organic polymers having a diorganohydrogen silyl group are mentioned, and preferably it is an organohydrogen siloxane. The organohydrogen has a linear, cyclic, branched or net-like molecular structure, and polymethyl hydrogen siloxane of which both molecular ends capped with trimethyl siloxy group, dimethyl siloxane.methyl hydrogen siloxane copolymer of which both molecular ends capped with trimethyl siloxy group, dimethyl siloxane.methyl hydrogen siloxane.methyl phenyl siloxane copolymer of which both molecular ends capped with trimethyl siloxy group, dimethyl polysiloxane of which both molecular ends capped with dimethyl hydrogen siloxy group, dimethyl siloxane methyl phenyl siloxane copolymer of which both molecular ends capped with dimethyl hydrogen siloxy group, methyl phenyl polysiloxane of which both molecular ends capped with dimethyl hydrogen siloxy group, organopolysiloxane copolymer constituted with a siloxane units expressed by formula: $R_3SiO_{1/2}$, a siloxane unit expressed by formula: $R_2HSiO_{1/2}$, a siloxane unit expressed by formula: $SiO_{4/2}$, a siloxane unit expressed by formula: $R_2HSiO_{1/2}$ and a siloxane unit expressed by formula: $SiO_{1/2}$, organopolysiloxane copolymer constituted with a siloxane unit expressed by formula: $R_2HSiO_{1/2}$ and a siloxane unit expressed by formula: $SiO_{4/2}$: $HSiO_{3/2}$, organopolysiloxane copolymer constituted with a siloxane unit expressed by formula: $RHSiO_{2/2}$ and a siloxane unit expressed by formula: $RSiO_{3/2}$ or a siloxane unit expressed by formula: $HSiO_{3/2}$, etc. are mentioned. Two kinds or more of these organopolysiloxanes may be used. In the above formula, R is a monovalent hydrocarbon group other than alkenyl group, and alkyl groups such as methyl group, ethyl group, propyl group, butyl group, pentyl group, hexyl group or heptyl group; aryl groups such as phenyl group, tolyl group, xylyl group or naphthyl group; aralkyl groups such as benzyl group or phenethyl group; halogenated alkyl groups such as chloromethyl group, 3-chloropropyl group or 3,3,3-trifluoropropyl group, are exemplified.

As the organic polymer having a diorganohydrogen silyl group, for example, an oligomer in which dimethyl hydrogen silyl group-containing acryl-based monomer such as dimethyl hydrogen silyl(meth)acrylate or dimethyl hydrogen silyl propyl(meth)acrylate and a monomer such as methyl (meth)acrylate, ethyl(meth)acrylate, butyl(meth)acrylate, ethyl hexyl (meth)acrylate, lauryl(meth)acrylate, styrene, α-methyl styrene, maleic acid, vinyl acetate, allyl acetate, are copolymerized, is mentioned.

A content of the SiH group-containing compound is, in view of curability of the silicone rubber layer, it is preferable to be 0.5 wt % or more in the silicone liquid, and 1 wt % or more is more preferable. 20 wt % or less is preferable, and 15 wt % or less is more preferable.

As the reaction inhibitor, a nitrogen-containing compound, a phosphorus-based compound, an unsaturated alcohol, etc. are mentioned, but an acetylene group-containing alcohol is preferably used. By containing such a reaction inhibitor, it becomes possible to control curing speed of the silicone, rubber layer. As to a content of the reaction inhibitor is, in view of stability of the silicone liquid, 0.01 wt % or more in the silicone liquid is preferable, and 0.1 wt % or more is more preferable. In view of curability of the silicone rubber layer, 20 wt % or less in the silicone liquid is preferable, and 15 wt % or less is more preferable.

The curing catalyst is selected from publicly known catalysts, but preferably, it is a platinum-based compound, and concretely, platinum (simple substance), platinum chloride, chloroplatinic acid, olefin-coordinated platinum, alcohol-modified complex of platinum or methyl vinyl polysiloxane complex of platinum, etc. can be exemplified. A content of the curing catalyst is, in view of curability of the silicone rubber layer, 0.001 wt % or more in the silicone liquid is preferable, and 0.01 wt % or more is more preferable. In view of stability of the silicone liquid, 20 wt % or less is preferable; and 15 wt % or less is more preferable.

Furthermore, other than these components, a publicly known filler such as a hydroxyl group-containing organopolysiloxane, a hydrolyzable functional group-containing silane (or siloxane), silica for the purpose of enhancing rubber strength, a publicly known silane coupling agent for the purpose of improving adhesion may be contained. As the silane coupling agent, alkoxysilanes, acetoxysilanes, ketoximino silanes or the like are preferable, and in particular, those having a vinyl group or an allyl group are preferable.

The condensation reaction type silicone rubber layer is made from a composition (silicone liquid) which contains at least a hydroxyl group-containing organopolysiloxane, a cross-linking agent (deacetation type, deoximation type, dealcoholization type, deamination type, deacetonation type, deamidation type, deaminoxylation type, etc.), and a curing catalyst.

The hydroxyl group-containing organopolysiloxane has a structure expressed by the above-mentioned general formula (I), which has hydroxyl group at its main chain end or in the main chain. Among them, those having hydroxyl group at its main chain end are preferable.

It is preferable that 50% or more of entire $R^1$ and $R^2$ in general formula (I) is methyl group, in view of ink repellency of the printing plate. In view of its handling properties and ink repellency of the printing plate and in view of scratch resistance, it is preferable that a weight average molecular weight of the hydroxyl group-containing organopolysiloxane is 10,000 to 600,000.

As a cross-linking agent used for the silicone rubber layer of condensation reaction type, acetoxysilanes, alkoxysilanes, ketoximino silanes, allyloxysilanes, etc., expressed by the following general formula (II) can be mentioned:

$$(R^3)_{4-n}SiX_n \qquad (II).$$

In the formula, n denotes an integer of 2 to 4, $R^3$ may be the same or different and denotes a substituted or unsubstituted alkyl group, alkenyl group, aryl group, or a combined group thereof, of which carbon number is 1 or more. X may be the same or different, and is halogen atom, alkoxy group, acyloxy group, ketoximino group, amino oxy group, amide group or alkenyl oxy group. In the above-mentioned formula, it is preferable that a number of the hydrolyzable group, n, is 3 or 4.

As concrete compounds, acetoxysilanes such as methyl triacetoxysilane, ethyl triacetoxysilane, vinyl triacetoxysilane, allyl triacetoxysilane, phenyl triacetoxysilane or tetraacetoxysilane, ketoximino silanes such as vinyl methyl bis (methyl ethyl ketoximino) silane, methyl tris(methyl ethyl ketoximino) silane, ethyl tris(methyl ethyl ketoximino) silane, vinyl tris(methyl ethyl ketoximino) silane, allyl tris (methyl ethyl ketoximino) silane, phenyl tris(methyl ethyl ketoximino) silane or tetrakis(methyl ethyl ketoximino) silane, alkoxysilanes such as methyl trimethoxysilane, methyl triethoxysilane, ethyl trimethoxysilane, ethyl triethoxy silane, tetraethoxysilane, tetrapropoxysilane, vinyl trimethoxysilane, vinyl triethoxysilane, allyl triethoxysilane or vinyl triisopropoxysilane, alkenyl oxysilanes such as vinyl trisisopropenoxysilane, diisopropenoxydimethyl silane or triisopropenoxymethyl silane, and tetraallyloxysilane, etc. are mentioned, but not limited thereto. Among these, in view of curing speed and handling properties of the silicone rubber layer, acetoxysilanes and ketoximino silanes are preferable.

It is preferable that a content of the cross-linking agent is, in view of stability of the silicone liquid, 0.5 wt % or more in the silicone liquid, and 1 wt % or more is more preferable. In view of strength of the silicone rubber layer or scratch resistance of the printing plate, 20 wt % or less in the silicone liquid is preferable, and 15 wt % or less is more preferable.

As the curing catalyst, organic carboxylic acids such as acetic acid, propionic acid or maleic acid, acids such as toluene sulfonic acid or boric acid, alkalis such as potassium hydroxyide, sodium hydroxide or lithium hydroxide, amine, metal allcoxides such as titanium tetrapropoxide or tionium tetrabutoxide, metal diketenates such as iron acetyl acetonate or titanium acetyl acetonate dipropoxide, organic acid salts of metal, etc. can be mentioned. Among these, organic acid salts of metal are preferable, especially, organic acid salt of a metal selected from tin, lead, zinc, iron, cobalt, calcium and manganese are preferable. As a part of concrete examples of such compound, dibutyl tin diacetate, dibutyl tin dioctate, dibutyl tin dilaurate, zinc octate, iron octate, etc. can be mentioned. It is preferable that a content of the curing catalyst is, in view of curability and adhesion of the silicone rubber layer, 0.001 wt % or more in the silicone liquid, and 0.01 wt % or more is more preferable. In view of stability of the silicone liquid, 15 wt % or less in the silicone liquid is preferable, and 10 wt % or less is more preferable.

Furthermore, other than these components, for the purpose of enhancing strength of rubber, publicly know fillers such as silica, and in addition, publicly known silane coupling agent may be contained.

In the color pigment-containing silicone liquid, color pigment-containing diluted silicone liquid or the silicone rubber layer to improve dispersibility of the color pigment, it is preferable to contain a pigment dispersant in the silicone rubber layer. By containing the pigment dispersant, it is possible to prevent an aggregation of the color pigment occurred when it is diluted with a solvent, or with a lapse of time, of the color pigment-containing (diluted) silicone liquid, to enable to obtain a good coating film. In the case where a coarse particle such as an undispersed color pigment his present in the diluted low viscosity color pigment-containing diluted silicone liquid, it can be removed by a filter, etc.

As the pigment dispersant, a pigment dispersant which wets the pigment surface well, and in addition, which is good in compatibility with low polarity compound such as solvent used for dilution of the organopolysiloxane or color pigment-containing silicone liquid is preferable, and if it is such a pigment dispersant, a publicly known pigment dispersant can be used. The pigment dispersant may also be used in the name of interface active agent or surface modifier. As the pigment dispersant, an organic complex compound comprising of a metal and an organic compound, an amine-based pigment dispersant, an acid-based pigment dispersant or a nonionic interface active agent, etc. can be mentioned. Among them, an organic complex compound comprising of a metal and an organic compound, or an amine-based pigment dispersant are preferable.

In the following, those preferably used as the organic complex compound comprising of a metal and an organic compound are exemplified. As the metal, Cu(I), Ag(I), Hg(I), Hg(II), Li, Na, K, Be(II), B(III), Zn(II), Cd(II), Al(III), Co(II), Ni(II), Cu(II), Ag(II), Au(III), Pd(II), Pt(II), Ca(II), Sr(II), Ba(II), Ti(IV), Va(III), V(IV), Cr(III), Mn(II), Mn(III), Fe(II), Fe(III), Co(III), Pd(IV), Pt(IV), Sc(III), Y(III), Si(IV), Sn(II), Sn(IV), Pb(IV), Ru(III), Os(III), Ir(III), Rb, Cs, Mg, Ni(IV), Ra, Zr(IV), Hf(IV), Mo(IV), W(IV), Ge, In, lanthanide, actinide, etc. are mentioned. Among these, Al, Ti, Mn, Fe, Co, Ni, Cu, Zn, Ge, In, Sn, Zr and Hf are preferable, and Al and Ti are more preferable.

As the organic compound, compounds having a coordinating group having O (oxygen atom), N (nitrogen atom), S (sulfur atom), etc. as donor atom are mentioned. As concrete examples of the coordinating group, as those having oxygen atom as its donor atom, —OH (alcohol, enol and phenol), —COOH (carboxylic acid), >C═O (aldehyde, ketone, quinone), —O-(ether), —COOR' (ester, R' denotes an aliphatic or aromatic hydrocarbon), —N═O (nitroso compound), —NO$_2$ (nitro compound), >N—O (N-oxide), —SO$_3$H (sulfonic acid), —PO$_3$H$_2$ (phosphorous acid), etc., as those having nitrogen atom as its donor atom, —NH$_2$ (primary amine, amide, hydrazine), >NH (secondary amine, hydrazine), >N— (tertiary amine), —N═N— (azo compound, heterocyclic compound), ═N—OH (oxime), —NO$_2$ (nitro compound), —N═O (nitroso compound), >C═N— (Schiff base, heterocyclic compound), >C═NH (aldehyde, and ketone imine, enamines), —NCS (isothiocyanato), etc., as those having sulfur atom as its donor atom, —SH (thiol), —S-(thioether), >C═S (thioketone, thioamide), ═S— (heterocyclic compound), —C(═O)—SH or —C(═S)—OH and —C(═S)—SH (thiocarboxylic acid), —SCN (thiocyanato), etc., are mentioned. Among them, it is preferable to use acid compounds such as carboxylic acid, phosphoric acid or sulfonic acid, and diketone, keto ester or diester compound which can form chelate ring with metal, in view of coordinating force with the metal. Concrete examples of the organic compound are mentioned in the following, but not limited thereto.

Chemical Formula 1

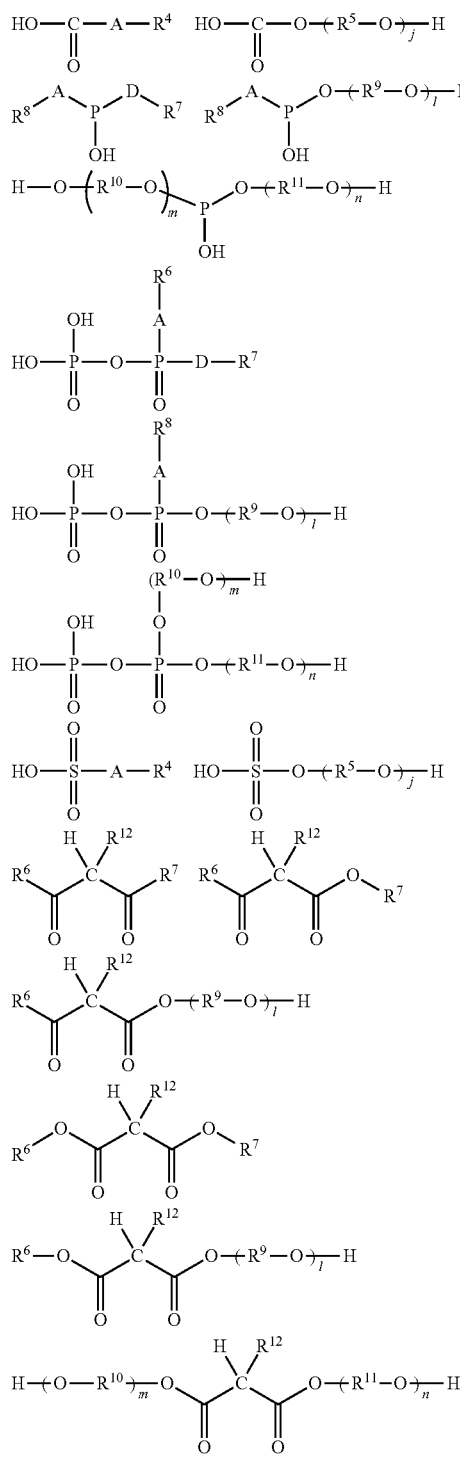

In the above-mentioned formula, $R^4$ denotes a saturated or unsaturated hydrocarbon group and may be linear, branched or cyclic, and may contain an aromatic ring. In view of dispersibility, it is preferable that a carbon number of $R^4$ is 8 or more. $R^5$ denotes a saturated or unsaturated divalent hydrocarbon group of a carbon number of 3 or more, and may be linear, branched or cyclic. j denotes a number of repetitions and it is an integer of 1 or more. In view of dispersibility, it is preferable that a total number of carbons contained in j×$R^5$ is 8 or more. $R^6$ and $R^7$ denote saturated or unsaturated hydrocarbon groups, and may be linear, branched or cyclic, and may contain an aromatic ring. In view of dispersibility, it is preferable that a total number of carbons of $R^6$ and $R^7$ is 8 or more. $R^8$ denotes a saturated or unsaturated hydrocarbon group of a carbon number of 1 or more and may be linear, branched or cyclic, and may contain an aromatic ring. $R^9$ denotes a saturated or unsaturated divalent hydrocarbon group of a carbon number of 3 or more, and may be linear, branched or cyclic. l denotes a number of repetitions and it is an integer of 1 or more. In view of dispersibility, it is preferable that a total number of carbons contained in $R^8$ and in one $R^9$ is 8 or more. $R^{10}$ and $R^{11}$ denote saturated or unsaturated divalent hydrocarbon group of a carbon number of 3 or more, and may be linear, branched or cyclic. Plural of $R^{10}$ and $R^{11}$ may be the same or different, respectively. Each of m and n denotes a number of repetitions and is an integer of 1 or more, respectively. In view of dispersibility, it is preferable that a total of carbon number contained in m×$R^{10}$ and carbon number contained in n×$R^{11}$ is 8 or more. $R^{12}$ denotes hydrogen, alkyl group or aryl group. Each of A and D denotes a divalent group expressed by any one of the following formulae, and they may be the same or different, respectively.

Chemical Formula 2

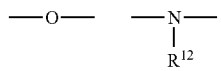

In the above-mentioned formulae, $R^{12}$ denotes hydrogen, alkyl group or aryl group.

The simplest organic complex compound used as the pigment dispersant can be obtained by stirring the above-mentioned organic compound and a metal alkoxide at room temperature or under heating, to exchange ligands. It is preferable that one molecule or more of the above-mentioned organic compound is coordinated to one metal.

An example of the organic complex compound comprising of a metal and an organic compound commercially sold is mentioned bellow. Aluminum-based: "Octope" (trademark) Al, "Olipe" (trademark) AOO, AOS (the above are produced by Hope Chemical Co.), "Plenact" (trademark) AL-M (produced by Ajinomoto Fine-Techno Co.), etc. Titanium-based: "Plenact" (trademark) KR-TTS, KR46B, KR55, KR41B, KR38S, KR138S, KR238S, KR338X, KR9SA (the above are produced by Ajinomoto Fine-Techno Co.), "KEN-REACT" (trademark) TTS-B, 5, 6, 7, 10, 11, 12, 15, 26S, 37BS, 43, 58CS, 62S, 36B, 46B, 101, 106, 110S, 112S, 126S, 137BS, 158DS, 201, 206, 212, 226, 237, 262S (the above are produced by Kenrich Petrochemicals, Inc.), etc.

The above-mentioned organic complex compounds can appropriately be used, especially, to an addition reaction type silicone rubber layer. Among them, an organic complex compound which does not contain a primary or secondary amine, phosphorus and sulfur in its molecule is, since it does not act as a catalyst poison of platinum catalyst, extremely appropriate when it is used to the addition reaction type silicone of which curing is accelerated by the platinum catalyst.

On the other hand, as amine-based pigment dispersants, there are monoamine type having one amino group in its molecule and polyamine type having plural amino groups in its molecule, and any of them can preferably be used. Concretely, "Solsperse" (trademark) 9000, 13240, 13650, 13940, 17000, 18000, 19000, 28000 (the above are produced by Avecia Ltd.) or, amine compounds described in the following general formulae can be mentioned.

Chemical Formula 3

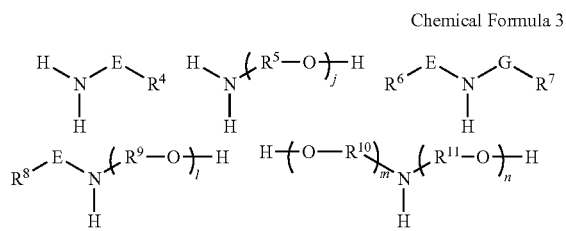

In the above-mentioned formulae, $R^4$ denotes a saturated or unsaturated hydrocarbon group, and may be linear, branched or cyclic, and may contain an aromatic ring. In view of dispersibility, it is preferable that a carbon number of $R^4$ is 8 or more. $R^5$ denotes a saturated or unsaturated divalent hydrocarbon group of carbon number of 3 or more, and may be linear, branched or cyclic. j denotes a number of repetitions, and is an integer of 1 or more In view of dispersibility, it is preferable that a total of carbon number contained in j×$R^5$ is 8 or more. $R^6$ and $R^7$ denote saturated or unsaturated hydrocarbon groups, and may be linear, branched or cyclic, and may contain an aromatic ring. In view of dispersibility, it is preferable that a total of carbon numbers of $R^6$ and $R^7$ is 8 or more. $R^8$ denotes a saturated or unsaturated hydrocarbon group of a carbon number of 1 or more, and may be linear, branched or cyclic, and may contain an aromatic ring. $R^9$ denotes a saturated or unsaturated divalent hydrocarbon group of carbon number of 3 or more, and may be linear, branched or cyclic. l denotes a number of repetitions, and is an integer of 1 or more. In view of dispersibility, it is preferable that a total of carbon number contained in $R^8$ and contained in one $R^9$ is 8 or more. $R^{10}$ and $R^{11}$ denote saturated or unsaturated divalent hydrocarbon group of carbon number of 3 or more, and may be linear, branched or cyclic. Plural of $R^{10}$ and $R^{11}$ may be the same or different, respectively. Each of m and n denotes a number of repetitions, and is an integer of 1 or more, respectively. In view of dispersibility, it is preferable that a total of carbon number contained in m×$R^{10}$ and carbon number contained in n×$R^{11}$ is 8 or more. E and G denote divalent, groups expressed in any one of the following formulae, and may be the same or different, respectively.

Chemical Formula 4

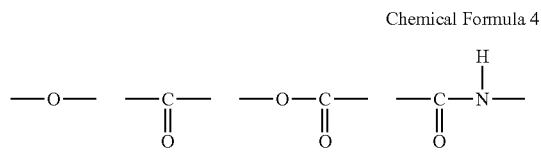

It is preferable that the pigment dispersant is contained in an amount of 2 to 30 mg/m² with respect to surface area of pigment. In other words, for example, in case where a pigment of which specific surface area is 50 m²/g is contained by 10 g, it is preferable that an amount of the pigment dispersant contained is 1 to 15 g.

As the solvent used for dispersing the color pigment or diluting the silicone liquid or color pigment-containing silicone liquid, a low polarity solvent is preferable, and among them, it is preferable to use a solvent of which solubility parameter is 17.0 $(MPa)^{1/2}$ or less, in view of solubility and coatability, and to be 15.5 $(MPa)^{1/2}$ or less is more preferable. The solvent may be used alone or in combination of 2 kinds or more. In the case where 2 kinds or more solvents are used, it is preferable that any one of the solvents has a solubility parameter of 17.0 $(MPa)^{1/2}$ or less.

The solubility parameter is the amount of δ defined by $δ=(ΔH/V)^{1/2}$ when molar heat of vaporization is ΔH and molar volume is V. As the unit of solubility parameter, $(MPa)^{1/2}$ is used. As solubility parameters, $(cal·cm^{-3})^{1/2}$ is also usually used and between both parameters, there is an relational equation of δ $(MPa)^{1/2}=2.0455×δ$ $(cal·cm^{-3})^{1/2}$. Concretely, solubility parameter 17.0 $(MPa)^{1/2}$ corresponds to 8.3 $(cal·cm^{-3})^{1/2}$. As solvent of solubility parameter 17.0 $(MPa)^{12}$ or less, aliphatic saturated hydrocarbon, aliphatic unsaturated hydrocarbon, alicyclic hydrocarbon, halogenated hydrocarbon or ethers are mentioned. For example, aliphatic saturated hydrocarbons such as hexane, heptane, octane, nonene, decane, undecane, dodecane, isooctane, "Isopar" (trademark) C, "Isopar" (trademark) E, "Isopar" (trademark) G, "Isopar" (trademark) H, "Isopar" (trademark) K, "Isopar" (trademark) L or "Isopar" (trademark) M (produced by Exxon Chemical Co.), aliphatic unsaturated hydrocarbons such as hexene, heptene, octene, nonene or decene, alicyclic hydrocarbons such as cyclopentane, cyclohexane or methyl cyclohexane, halogenated hydrocarbons such as trifluorotrichloroethane, ethers such as diethyl ether, diisopropyl ether or diisobutyl ether, are mentioned, but not limited thereto. In view of cost and safety, aliphatic and alicyclic hydrocarbon are preferable. It is preferable that a carbon number of these aliphatic and alicyclic hydrocarbons are 4 to 20, and a carbon number of 6 to 15 is more preferable.

In the waterless planographic printing plate precursor, as a film thickness of the silicone rubber layer, 0.5 to 20 g/m² is preferable. By making the film thickness to 0.5 g/m² or more, ink repellency, scratch resistance or printing durability of printing plate becomes sufficient, and by making to 20 g/m² or less, without being disadvantageous in view of cost, a decrease of developability or ink mileage is hard to occur.

As the photo(heat)sensitive layer, any type of photo(heat) sensitive layers proposed so far as a photo(heat)sensitive layer for photo(heat)sensitive layer leaving type waterless planographic printing plate can be used. In the following, it is explained with reference to concrete examples, but it is not limited thereto.

(Heat Sensitive Layer-1) Heat Sensitive Layer for Negative Type Waterless CTP Planographic Printing Plate Precursor For example, the heat sensitive layer such as described in JP-H11-221977A can be mentioned. It is a heat sensitive layer in which a cross-linked structure by a cross-linking agent is formed in a state of raw plate, and is of a type in which adhesion between heat sensitive layer and silicone rubber layer is decreased by heat generated by near infra-red laser irradiation. By a later development treatment, the silicone rubber layer in the portion where laser light was irradiated is removed. The heat sensitive layer of laser irradiated portion is left even after the development.

(Heat Sensitive Layer-2) Heat Sensitive Layer for Negative Type Waterless CTP Planographic Printing Plate Precursor For example, the heat sensitive layer containing bubbles such as described in JP-2005-300586A can be mentioned. It is a heat sensitive layer in which a cross-linked structure by a cross-linking agent is formed in a state of raw plate, and is of a type in which adhesion between heat sensitive layer and silicone rubber layer is decreased by heat generated by near infra-red laser irradiation. By a later development treatment, the silicone rubber layer in the portion where laser light was irradiated is removed. The heat sensitive layer of laser irradiated portion is left even after the development.

(Heat Sensitive Layer-3) Heat Sensitive Layer for Negative Type Waterless CTP Planographic Printing Plate Precursor For example, the heat sensitive layer such as described in JP-H9-131981A can be mentioned. It is a heat sensitive layer of a type broken by heat generated by near infra-red laser irradiation. By removing this portion by a development, a surface silicone rubber layer is removed together with the broken heat sensitive layer to become an image area. In general, such a heat sensitive layer is, in view of printing plate inspectability, used by completely breaking the heat sensitive layer by laser in depth direction. However, to break the heat sensitive layer completely, a high energy laser irradiation is necessary, and due to that, there are various bad influences such as poor reproducibility of fine image, pollution of optical system by abrasion sludge, decrease of the laser life, etc. When the laser energy is decreased, there appears a region in which the upper silicone rubber layer is removed while leaving most of the heat sensitive layer. Since most of the heat sensitive layer is left, plate inspection is difficult, but bad influences other than the printing plate inspectability are significantly prevented. In the case where the color pigment-containing silicone rubber layer is provided, even most of the heat sensitive layer is left, a plate inspection becomes possible.

(Heat Sensitive Layer-4) Heat Sensitive Layer for Negative Type Waterless CTP Planographic Printing Plate Precursor For example, thin films of a metal, or oxide, carbide, nitride, boride or fluoride thereof such as described in JP-H7-314934A or JP-H9-086065A, can be mentioned. The metal thin film is broken by heat generated by near infra-red laser irradiation. By removing this portion by development, surface silicone rubber layer is peeled off simultaneously, to become an image area. Similar to Heat sensitive layer-3, in general, such a metal thin film is also used by completely breaking by laser in depth direction, in view of printing plate inspectability. However, to break the metal thin film completely, a high energy laser irradiation is necessary, and due to that, there are various bad influences such as poor reproducibility of fine image, pollution of optical system by abrasion sludge, decrease of the laser life, etc. When the laser energy is decreased, there appears a region in which the upper silicone rubber layer is removed while leaving most of the metal thin film. Since most of the metal thin film is left, plate inspection is difficult, but bad influences other than the printing plate inspectability are significantly prevented. In the case where the color pigment-containing silicone rubber layer is provided, even most of the metal thin film is left, a plate inspection becomes possible.

(Heat sensitive layer-5) Heat sensitive layer for positive type waterless CTP planographic printing plate precursor.

For example, heat curing type heat sensitive layers such as described in JP-H11-157236A or JP-H11-240271A can be mentioned. They are heat sensitive layers of a type in which a cross-linked structure by heat activatable cross-linking agent is formed by heat generated by near infra-red laser irradiation. By a later development treatment, silicone rubber layer of the portion where the laser light is irradiated is left, and silicone rubber layer of unirradiated portion is removed. The heat sensitive layer of the laser unirradiated portion is also left after development.

(Photosensitive layer-1) Photosensitive Layer for Negative Type Waterless Planographic Printing Plate Precursor For example, photosensitive layers such as described in JP-H11-352672A can be mentioned. By increasing solubility of photosensitive layer surface in pre-treating liquid by UV ray irradiation, silicone rubber layer of a portion where the UV ray is irradiated is removed by a development treatment, and silicone rubber layer of unirradiated portion is left. The photosensitive layer of the exposed portion is also left after the development.

(Photosensitive Layer-2) Photosensitive Layer for Positive Type Waterless Planographic Printing Plate Precursor For example, photosensitive layers such as described in JP-H6-118629A can be mentioned. Ethylenic unsaturated double bond-containing compound is polymerized by a radical generated by UV ray irradiation, and by a development treatment, silicone rubber layer of the UV ray irradiated portion is left, and silicone rubber layer of the unirradiated portion is removed. Photosensitive layer of the unexposed portion is also left after the development.

As the substrate, dimensionally stable publicly known paper, metal, film, etc., which have conventionally been used as substrates of printing plate, can be used. Concretely, paper, paper laminated with a plastic (polyethylene, polypropylene, polystyrene, etc.), metal plates such as of aluminum (containing aluminum alloy), zinc or copper, plastic films such as of cellulose acetate, polyethylene terephthalate, polyethylene, polyester, polyamide, polyimide, polystyrene, polypropylene, polycarbonate or polyvinyl acetal, paper or plastic film laminated or vapor-deposited with the above-mentioned metals, etc., are mentioned. The plastic film can be used either of transparent or opaque one. Among them, it is preferable to use an opaque film in view of printing plate inspectability.

Among these substrates, aluminum plate is especially preferable since it is dimensionally extremely stable, and in addition, cheap. As a flexible substrate for quick printing, polyethylene terephthalate film is especially preferable.

For the purpose of such as improving adhesion between the substrate and the photosensitive layer, preventing a light halation, improving printing plate inspectability, improving heat insulation properties or improving printing durability, a primer layer may be provided on the above-mentioned substrate. As primer layer, for example, primer layers such as described in JP-2004-199016A can be mentioned.

The waterless planographic printing plate precursor constituted as the above-mentioned may have, for the purpose of protecting the silicone rubber layer, a protective film or inserting paper. The protective film and the inserting paper may be provided as any one of them alone, or may be provided both of them in combination.

As the protective film, a film of a thickness of 100 μm or less which transmit well a light of wavelength of exposure light source is preferable. As representative examples, polyethylene, polypropylene, polyvinyl chloride, polyethylene terephthalate, cellophane, etc, can be mentioned. For the purpose of preventing a sensitization of precursor by being exposed to daylight, various light absorbent such as described in JP-H2-063050A, a photofading material or photocoloring material may be provided on the protective film. In the case where an exposure is carried out by using an original image film, in view of close contactness with the original image film, it is preferable to use a protective film processed into a rugged pattern such as described in JP-S55-55343A or JP-H2-063051A.

As the inserting, paper, those having a weight of 30 to 120 g/m$^2$ are preferable, and 30 to 90 g/m$^2$ is more preferable. When the weight is 30 g/m$^2$ or more, the mechanical strength is sufficient, and when it is 120 g/m$^2$ or less, not only being advantageous in cost, but also a laminate of the waterless planographic printing plate precursor and the paper becomes thin, to bring about a better handling properties. As examples of inserting paper preferably used, for example, data recording paper of 40 g/m$^2$ (produced by Nagoya Pulp Co.), metal inserting paper of 30 g/m$^2$ (produced by Nagoya Pulp Co.), unbleached craft paper of 50 g/m² (produced by Chuetsu Pulp & Paper Co.), paper for NIP of 52 g/m² (produced by Chuetsu Pulp & Paper Co.), pure white roll paper of 45 g/m² (produced by Oji Paper Co.), Clupack of 73 g/m² (produced by Oji Paper Co.), etc., are mentioned, but not limited thereto.

Next, a production method of the waterless planographic printing plate precursor is described. On a substrate of which surface to be coated is defatted, as required, a primer liquid or a diluted primer liquid in which the primer liquid is diluted with a solvent is coated, to provide a primer layer. It may be subjected to a heat treatment for a drying or curing. After that, in the same way as the primer layer, by providing a photo (heat)sensitive layer and a silicone rubber layer in this order, it is possible to obtain a waterless planographic printing plate precursor. As coating method of each liquid, coating methods by a slit die coater, a direct gravure coater, an offset gravure coater, a reverse roll coater, a natural roll coater, an air knife coater, a roll blade coater, a baribar roll blade coater, a two-stream coater, a rod coater, a wire bar coater, a dip coater, a curtain coater, a spin coater, etc., are employed. In the case where a metal thin film is provided as the heat sensitive layer, ordinary methods such as a vapor-deposition method or a sputtering method are employed. For heating the respective layers, ordinary heating apparatus such as a hot air drier or infrared drier are used.

The color pigment-containing silicone rubber layer is obtained by coating (i) a color pigment-containing silicone liquid (no solvent), or (ii) a color pigment-containing diluted silicone liquid (containing solvent) on the photo(heat)sensitive layer. If necessary, a heat treatment may be carried out for drying or curing. Hereafter, concrete preparation methods of the respective liquids are described.

(i) Color Pigment-Containing Silicone Liquid (No Solvent)

The color pigment-containing silicone liquid is obtained, for example, by adding a cross-linking agent, and as required, other additives (reaction inhibitor, reaction catalyst, etc.) into a color pigment dispersed silicone paste obtained by uniformly dispersing and mixing a hydroxyl group or vinyl group-containing organopolysiloxane and a color pigment, and if necessary, a pigment dispersant and a fine particle, by a dispersing machine such as a three roll mill, a ball mill, a beads mill, a sand mill, a disperser, a homogenizer, an attritor, an ultrasonic dispersing machine, etc., and stirred into a uniform component, and by removing air foam mixed in the liquid. The defoamation may be a defoamation under atmospheric pressure or a reduced-pressure defoamation, but the reduced-pressure defoamation is more preferable.

(ii) Color Pigment-Containing Diluted Silicone Liquid (Containing Solvent)

It is preferable that the color pigment-containing diluted silicone liquid contains, in view of dispersibility of color pigment, a pigment dispersant. Production method of the color pigment-containing diluted silicone liquid is explained with: reference to examples. First, while the color pigment dispersed silicone paste, obtained by uniformly dispersing and mixing a hydroxyl group or vinyl group containing organopolysiloxane, a color pigment, a pigment dispersant, and if necessary, a fine particle by the above-mentioned dispersing machine, is stirred, it is diluted with a solvent. It is preferable that this is filtered by an ordinary filter such as of a paper, plastic or glass, to remove impurities (such as a coarse particle of insufficiently dispersed color pigment) in the diluted liquid. Regarding, the diluted liquid after the filtration, it is preferable to remove water in the system by a bubbling with dried air or dried nitrogen or the like. To the diluted liquid of which water is sufficiently removed, a cross-linking agent and, as required, other additives (reaction inhibitor, reaction catalyst, etc.) are added and stirred to make the component uniform, and air foam mixed in the liquid is removed. The defoamation may be a defoamation under atmospheric pressure or a reduced-pressure defoamation.

Furthermore, as other method for preparing the color pigment-containing diluted silicone liquid, a method of separately preparing a color pigment dispersion and a silicone liquid or diluted silicone liquid beforehand and then both liquids are mixed is mentioned. The color pigment dispersion is obtained by adding a color pigment, and if necessary, a fine particle, in a solution containing at least a pigment dispersant and a solvent, and uniformly dispersing and mixing by the above-mentioned dispersing machine. On the other hand, the silicone liquid is obtained by mixing a hydroxyl group or vinyl group-containing organopolysiloxane, cross-linking agent, and as required, other additives (reaction inhibitor, reaction catalyst, etc.). By diluting the obtained silicone liquid with a solvent, a diluted silicone liquid can be obtained. As an advantage of this preparing method, it is mentioned that, compared to the color pigment dispersed silicone paste, since viscosity of the color pigment dispersion is very low, re-dispersing of the color pigment aggregated with a lapse of time is easy. Since the color pigment is dispersed in the diluting solvent beforehand, compared to the method in which the color pigment dispersed silicone paste is diluted with a solvent, an aggregation of the color pigment at diluting with the solvent is hard to occur. Furthermore, at the dispersing step using a dispersing machine, since the color pigment dispersion does not contain a silicone material, there is no staining of the dispersing machine with the silicone material.

At coating the color pigment-containing silicone liquid or color pigment-containing diluted silicone liquid, it is preferable to remove water content deposited on the photo(heat) sensitive layer surface as completely as possible in view of adhesive properties. Concretely, a method of coating the color pigment-containing silicone liquid or color pigment-containing diluted silicone liquid in a space in which water content was removed by filling or continuously supplying a dried gas is mentioned.

It is preferable that the color pigment-containing silicone liquid or color pigment-containing diluted silicone liquid is immediately heated after the coating in view of curability or adhesive properties with the photo(heat)sensitive layer.

It is preferable to provide any one of a protective film or inserting paper, or on the other hand both, on the obtained waterless planographic printing plate precursor and store, in view of protection of the plate surface.

Thus obtained waterless planographic printing plate precursor is exposed image-wise through the protective film or after the protective film is peeled off, by being exposed via an image film or by being subjected to a laser scanning exposure by a digital data. As exposure light sources, for example, a carbon arc lamp, a low pressure mercury lamp, a high pressure mercury lamp, a super high-pressure mercury lamp, a xenon lamp, a metal halide lamp, a fluorescent lamp, a tungsten lamp, a halogen lamp, a UV light laser, a visible light laser, a (near) infrared light laser, etc., are mentioned.

The precursor after the exposure is developed by an rubbing treatment in a presence or absence of a developing liquid. The rubbing treatment can be carried out by rubbing the printing plate surface with a nonwoven fabric, absorbent cotton, cloth, sponge, brush or the like, or by rubbing the printing plate surface with a nonwoven fabric, absorbent cotton, cloth, sponge or the like impregnated with the developing liquid. It can also be carried out by, after pre-treating the printing plate surface with the developing liquid, rubbing by a rotating brush while showering water or the like, or by ejecting a high-pressure water, hot water or water vapor to the printing plate surface.

Before the development; a pre-treatment in which the plate is immersed for a predetermined time in the pre-treating liquid may be carried out As the pre-treating liquid, for example, water or water added with, a polar solvent such as alcohol, ketone, ester or carboxylic acid, at least 1 kind of solvent such as aliphatic hydrocarbons or aromatic hydrocarbons added with a polar solvent, or a polar solvent, are used. To the above-mentioned developing liquid composition, it is freely done to add a publicly known surface active agent. As the surface active agent, in view of safety and cost for disposal, it is preferable that a pH of its aqueous solution is 5 to 8. It is preferable that a content of the surface active agent is 10 wt % or less of the developing liquid. Such a developing liquid is high in safety and preferable in view of economics such as cost for disposal. Furthermore, it is preferable to use a glycol compound or a glycol ether compound as the main component, and it is more preferable to contain an amine compound together.

As the pre-treating liquid and the developing liquid, those disclosed relating to pre-treating liquid and developing liquid for waterless planographic printing plate precursor such as described in JP-S63-179361A, JP-H4-163557A, JP-H4-343360A, JP-H9-34132A, publication of JP Patent No. 3716429, can be used. As concrete examples of the pre-treating liquid, PP-1, PP-3, PP-F, PP-FII, PTS-1, PH-7N, CP-1, NP-1, DP-1 (all are produced by Toray Industries, Inc.), etc., can be mentioned.

The above-mentioned development treatment can also be carried out automatically by an automatic developing machine. As the automatic developing machine, a machine provided with a development portion only, a machine provided with a pre-treatment portion and a development portion in this order, a machine provided with a pre-treatment portion, a development portion and a post-treatment portion in this order and a machine provided with a pre-treatment portion, a development portion, a post-treatment portion and a water-washing portion in this order, etc., can be used. As concrete examples of such automatic developing machines, TWL-650 series, TWL-860 series, TWL-1160 series (all are produced by Toray Industries, Inc), etc., or automatic developing machines disclosed in such as JP-H4-2265A, JP-H5-2272A and JP-H5-6000A, can be mentioned, and these can be used alone or in a combination.

In the case where printing plates subjected to the development treatment are stored in a piled up state, for the purpose of protecting the printing plates, it is preferable to insert inserting paper between the plates.

EXAMPLES

In the following, this disclosure is explained in more detail with reference to examples. Weighing of each silicone rubber layer constituting component was carried out in a glove box of which water content had been discharged, and by dispersing and mixing the each constituting component in a container filled with dried nitrogen gas, a silicone liquid or diluted silicone liquid was prepared. Coloring matter fixation and printing plate inspectability after development in each example were evaluated in the following way.
<Evaluation of Coloring Matter Fixation>
  (A) Silicone rubber layers of waterless planographic printing plate precursor after 1 day and 7 days from preparation were visually observed and evaluated by the following criteria:
    ⊙⊙: Coloring matter fixing in silicone rubber layer was extremely good (absorption of coloring matter by protective film or aggregation of coloring matter in silicone rubber layer was not found).
    ○: Coloring matter fixing in silicone rubber layer is good (absorption of coloring matter by protective film or aggregation of coloring matter in silicone rubber layer was almost not found).
    x: Coloring matter fixing in silicone rubber layer is bad (absorption of coloring matter by protective film or aggregation of coloring matter in silicone rubber layer was found many).
    -: Coloring matter is not contained in silicone rubber layer.
  (B) Ink solvent "Dialene" 168 (produced by Mitsubishi Chemical Corp.) was dropped on silicone rubber layers of waterless planographic printing plate precursor after 1 day and 7 days from preparation. After passing 1 hour, the ink solvent on the silicone rubber layer was wiped off by Haize Gauze (produced by Asahi Kasei Corp.), and the Haize Gauze by which the ink solvent was wiped off was visually observed and evaluated by the following criteria:
    ⊙⊙: No coloring matter was extracted.
    x: Coloring matter was extracted.
    -: Coloring matter is not contained in silicone rubber layer.
<Determination of Reflection Density>

Reflection densities of image area (solid portion) and non-image area of waterless planographic printing plate obtained by exposure and development were measured by a reflection density meter: "Macbeth" RD918 (produced by Macbeth). In more concrete, a color to be measured (any one of yellow, magenta or cyan) was selected, and it was confirmed that measured value of reflection density was correct by using standard plate attached to the reflection density meter (white portion, reflection density: 0.06, black portion, reflection density: 1.80), and next, reflection densities of the image area (solid portion) and of the non-image area of the waterless planographic printing plate obtained by the exposure and development were measured 3 times, respectively, and their average value was taken as reflection density (the third decimal places of the average value was rounded off).
<Evaluation of Visual Printing Plate Inspectability>

Printing plates was obtained by exposure and development of waterless planographic printing plate precursor after 1 day and 7 days from preparation. Halftone dot of 1 to 99% (175 lpi) of the printing plate was observed by a loupe (x50), and evaluated by the following criteria:
    ⊙⊙: There was a sufficient color contrast between image area and non-image area, and an observation of halftone dot (1 to 99%) by loupe was possible.
    ○: There was a color contrast between image area and non-image area, and an observation of halftone dot (3 to 97%) by loupe was possible.
    x: There was no color contrast between image area and non-image area, and an observation of halftone dot by loupe was impossible.
<Determination of Tone Value>

Tone value of each halftone dot (175 lpi) of 5%, 20%, 35%, 50%, 65%, 80%, 95% on waterless planographic printing plate obtained by exposure and development was measured by a tone value measuring, instrument: "ccDot" type 4 (produced by Centurfax Co.). In more concrete, a color to be measured (any one of yellow, magenta or cyan) was selected, and tone value of 50% halftone dot on the waterless planographic printing plate obtained by the exposure and development was measured 3 times, and next, tone value of each halftone dot was measured 3 times, respectively, in the order of 5%, 20%, 35%, 50%, 65%, 80%, 95%, and their average was taken as the tone value (the first decimal place of the average value was rounded off). Whereas, in the waterless planographic printing plate precursor, since the silicone rubber layer of the uppermost layer is colored, the waterless planographic printing plate after the exposure and development becomes a negative-wise image (non-image area: deep color, image area: tint). Accordingly, tone value measurement was carried out in negative (indication in the instrument: (minus)) mode. Determination was made by the following criteria:

- ⊚: Difference of reflected light intensities between image area and non-image area was large, and an accurate reading was possible.
- ○: Difference of reflected light intensities between image area and non-image area was a little bit small, and there was a part in which an accurate reading was impossible.
- ×: the difference of reflected light, intensities between image area and non-image area was small, and reading was impossible at all.

Example 1

On an defatted aluminum substrate (produced by Mitsubishi Aluminum Co.) of 0.24 mm thickness, the following described primer layer composition liquid was coated, and dried at 200° C. for 90 seconds, to provide a primer layer of film thickness 10 g/m².

<Primer Layer Composition Liquid>
(a) Epoxy resin: "Epilcote" (trademark) 1010 (produced by Japan Epoxy Resins Co.): 35 wt parts
(b). Polyurethane: "Sanprene" (trademark) LQ-T1331D (produced by Sanyo Chemical Industries, Ltd., solid component concentration: 20 wt %): 375 wt parts
(c) Aluminum chelate: "Aluminum Chelate" ALCH-TR (produced by Kawaken Fine Chemicals Co.): 10 wt parts
(d) Leveling agent: "Disparlon" (trademark) LC951 (produced by Kusumoto Chemicals, Ltd., solid component: 10 wt %): 1 wt parts
(e) Titanium oxide: N,N-dimethyl formamide dispersion of "Tipaque" (trademark) CR-50 (produced by Ishihara Sangyo Kaisha Ltd.) (titanium oxide 50 wt %): 60 wt parts
(f) N,N-dimethyl formamide: 730 wt parts
(g) Methyl ethyl ketone: 250 wt parts.

Next, the following described heat sensitive layer composition liquid-1 was coated on the above-mentioned primer layer, and heated at 120° C. for 90 seconds, to provide a heat sensitive layer of a film thickness 1.5 g/m².

<Heat Sensitive Layer Composition Liquid-1>
(a) Infrared ray absorbing dye: "Projet" 825LDI (produced by Avecia Co.): 10 wt parts
(b) Titanium chelate: "Nacem" titanium (produced by Nihon Kagaku Sanyo Co., solid component concentration: 73 wt %): 11 wt parts
(c) Phenol formaldehyde novolac resin: "Sumilite Resin" PR50731 (produced by Sumitomo Durez Co.): 75 wt parts
(d) Polyurethane: Solvent substituted product of "Sanprene" (trademark) IB465 (produced by Sanyo Chemical Industries, Ltd.) (substituting solvent: tetrahydrofuran, solid component: 15 wt %): 47 wt parts
(e) Methyl ethyl ketone: 422 wt parts
(f) Ethanol: 85 wt parts
(g) Isoparaffin: "Isopar" (trademark) H (produced by Esso Chemicals Co.): 17 wt parts.

Next, following mentioned color pigment-containing silicone liquid-1 prepared just before coating was coated on the above-mentioned heat sensitive layer and heated at 130° C. for 90 seconds to provide a silicone rubber layer of film thickness 2.0 g/m². The silicone rubber layer just after the heating had been completely cured. On the silicone rubber layer just after the heating, a polypropylene film: "Torayfan" (produced by Toray Industries, Inc.) of 6 μm was laminated, to obtain a negative type waterless CTP planographic printing plate precursor.

<Color Pigment-Containing Silicone Liquid-1>

By dispersing and mixing the following described (a) and (b) by using a three roll mill: "Exakt" M-50 (produced by Nagase Screen Printing Research Co.), a color pigment-containing silicone paste was obtained. To the obtained color pigment-containing silicone paste, the (c) to (e) were added and sufficiently stirred until it become uniform. The obtained color pigment-containing silicone liquid was defoamed under a reduced pressure (90 kPa).

(a) α,ω-Divinyl polydimethyl siloxane: "DMS" V52 (weight average molecular weight 155000, produced by Gelest Inc.): 83 wt parts
(b) Organic red color pigment (anthraquinone-based): "Chromofine Red" 6605 (produced by Dainichiseika Color & Chemicals Mfg. Co.): 4 wt parts
(c) Methyl hydrogen siloxane: "HMS" 991 (produced by Gelest Inc.): 4 wt parts
(d) Vinyl tris(methyl ethyl ketoximino) silane: 3 wt parts
(e) Platinum catalyst: "SRX"212 (produced by Dow Corning Toray Silicone Co.): 6 wt parts.

For the obtained negative type waterless CTP planographic printing plate precursor, an evaluation of coloring matter fixation was carried out in the above-mentioned way. Even for the sample after passing 7 days, coloring matter fixing of the silicone rubber layer was good.

The printing plate precursor after peeling off the polypropylene film was set in an engraving machine: GX-3600 (produced by Toray Industries, Inc.), and by using a semiconductor laser (wavelength 830 nm), halftone dot of 1 to 99% (175 lpi) was exposed to an irradiation energy of 200 mJ/cm². Successively, by an automatic developing machine: TWL-860KII (produced by Toray Industries, Inc., pre-treatment portion liquid: none, development portion liquid: water, post-treatment portion liquid: water), at a printing plate transporting speed of 80 cm/min, a development of the above-mentioned exposed printing plate was carried out to obtain a waterless planographic printing plate. When the printing plate after the development was observed by a loupe, there was a sufficient color contrast between the image area and the non-image area, and halftone dot of 1 to 99% could be observed.

Example 2

A waterless CTP planographic printing plate precursor was prepared in the same way as Example 1 except using <Color pigment-containing silicone liquid-2> prepared by changing "Chromofine Red" 6605 of Example 1 to an inorganic blue color pigment (ferrocyan-based): N650 Milori Blue (produced by Dainichiseika Color & Chemicals Mfg. Co.), and it was evaluated.

The color pigment-containing silicone rubber layer just after the heating had been completely cured. Even for a sample after passing 7 days, color fixing of the silicone rubber layer was good. When the printing plate after the development was observed by a loupe, there was a sufficient color contrast between the image area and the non-image area, and halftone dot of 1 to 99% could be observed.

Example 3

A waterless CTP planographic printing plate precursor was prepared in the same way as Example 1 except using <Color pigment-containing silicone liquid-3> prepared by changing "Chromofine Red" 6605 of Example 1 to an organic blue color pigment (phthalocyanine-based): "Fastogen Blue" EP-CFE (produced by Dainippon Ink & Chemicals, Inc.), and it was evaluated.

The color pigment-containing silicone rubber layer just after the heating had been completely cured. Even for a sample after passing 7 days, coloring matter fixing of the silicone rubber layer was good. When the printing plate after the development was observed by a loupe, there was a sufficient color contrast between the image area and the non-image area, and halftone dot of 1 to 99% could be observed.

Example 4

A waterless CTP planographic printing plate precursor was prepared in the same way as Example 3, except changing <Color pigment-containing silicone liquid-3> of Example 3 to the following <Color pigment-containing diluted silicone liquid-1>, and it was evaluated.

<Color Pigment-Containing Diluted Silicone Liquid-1>

A color pigment-containing silicone paste was obtained by dispersing and mixing the following described (a) and (b) by a three roll mill. While stirring the obtained color pigment-containing silicone paste, the (c) was added to dilute, and next, it was bubbled for 20 minutes with dried nitrogen gas. While stirring the obtained liquid, the (d) to (0 were added and the mixture was stirred sufficiently until it became uniform. The obtained color pigment-containing diluted silicone liquid was subjected to a defoamation under atmospheric pressure.

(a) "DMS" V52: 83 wt parts
(b) "Fastogen Blue" EP-CFE: 4 wt parts
(c) Isoparaffin: "Isopar" (trademark) E (solubility parameter=14.5 $(MPa)^{1/2}$, produced by Esso Chemicals Co.): 900 wt parts
(d) "HMS" 991: 4 wt parts
(e) Vinyl tris(methyl ethyl ketoximino) silane: 3 wt parts
(f) "SRX" 212: 6 wt parts.

The color pigment-containing silicone rubber layer just after the heating had been completely cured. Compared to the waterless planographic printing plate precursor obtained in Example 3, although a coloring of the silicone rubber layer was slightly inferior, even a sample after passing 7 days, coloring matter fixing of the silicone rubber layer was good. When the printing plate after the development was observed by a loupe, it was found that there was a color contrast between the image area and the non-image area and observation of halftone dot of 3 to 97% was possible.

Example 5

A waterless CTP planographic printing plate precursor was prepared in the same way as Example 1, except changing <Color pigment-containing diluted silicone liquid-1> of Example 4 to the following <Color pigment-containing diluted silicone liquid-2>, and it was evaluated.

<Color, Pigment-Containing Diluted Silicone Liquid-2>

A color pigment-containing silicone paste was obtained by dispersing and mixing the following described (a) to (c) by a three roll mill. While stirring the obtained color pigment-containing silicone paste, the (d) was added to dilute, and next, it was bubbled for 20 minutes with dried nitrogen gas. While stirring the obtained liquid, the (e) to (g) were added and the mixture was stirred sufficiently until it became uniform. The obtained color pigment-containing diluted silicone liquid was subjected to a defoamation under atmospheric pressure.

(a) "DMS" V52: 83 wt parts
(b) "Fastogen Blue" EP-CFE: 4 wt parts
(c) Organic complex compound: "Plenact" (trademark) KR-TTS (produced by Ajinomoto Fine-Techno Co.): 1.5 wt parts
(d) "Isopar" (trademark) E: 900 wt parts
(e) "HMS"-991: 4 wt parts
(f) Vinyl tris(methyl ethyl ketoximino) silane: 3 wt parts
(g) "SRX" 212: 6 wt parts.

The color pigment-containing silicone rubber layer just after the heating had been completely cured. Even for a sample after passing 7 days, coloring matter fixing of the silicone rubber layer was good. When the printing plate after the development was observed by a loupe, it was found that there was a sufficient color contrast between the image area and the non-image area, and observation of halftone dot of 1 to 99% was possible.

Example 6

A waterless CTP planographic printing plate precursor was prepared in the same way as Example 5, except using <Color pigment-containing diluted silicone liquid-3> prepared by changing "Plenact" (trademark) KR-TTS of Example 5 to an amine-based pigment dispersant: "Solsperse" (trademark) 19000 (produced by Avecia Co.), and it was evaluated.

Although curing of the color pigment-containing silicone rubber layer just after the heating was imperfect, the layer had been cured on the next day. Even for a sample after passing 7 days, coloring matter fixing of the silicone rubber layer was good. When the printing plate after the development was observed by a loupe, it was found that there was a sufficient color contrast between the image area and the non-image area, and observation of halftone dot of 1 to 99% was possible.

Example 7

A waterless CTP planographic printing plate precursor was prepared in the same way as Example 6, except changing <Color pigment-containing diluted silicone liquid-3> of Example 6 to the following <Color pigment-containing diluted silicone liquid-4>, and it was evaluated.

<Color Pigment-Containing Diluted Silicone Liquid-4>

A color pigment-containing silicone paste was obtained by dispersing and mixing the following described (a) to (c) by a three roll mill. While the obtained color pigment-containing silicone paste was stirred, (d) was added to dilute, and next, it was bubbled with dried nitrogen gas for 20 minutes. While the obtained liquid was stirred, (e) to (g) were added, and the mixture was well stirred until it became uniform. The obtained color pigment-containing diluted silicone liquid was subjected to a defoamation under atmospheric pressure.

(a) α,ω-Dihydroxypolydimethyl siloxane: "DMS" S51 (weight average molecular weight 139000, produced by Gelest Inc.): 89 wt parts (b) "Fastogen Blue" EP-CFE: 4 wt parts
(c) "Solsperse" (trademark) 19000: 1.5 wt parts
(d) "Isopar" (trademark) E: 900 wt parts
(e) Tetrakis(methyl ethyl ketoximino) silane: 1 wt parts
(f) Vinyl tris(methyl ethyl ketoximino) silane: 6 wt parts
(g) Dibutyl tin diacetate: 0.02 wt parts.

Although curing of the color pigment-containing silicone rubber layer just after the heating was imperfect, the layer had been cured on the next day. Even for a sample after passing 7 days, coloring matter fixing of the silicone rubber layer was good. When the printing plate after the development was observed by a loupe, it was found that there was a sufficient color contrast between the image area and the non-image area, and observation of halftone dot of 1 to 99% was possible.

Comparative Example 1

A waterless CTP planographic printing plate precursor was prepared in the same way as Example 7, except changing to <Diluted silicone liquid> prepared without adding "Fastogen Blue" EP-CFE and "Solsperse" (trademark) 19000 in <Color pigment-containing diluted silicone liquid-4> of Example 7, and it was evaluated.

Although curing of the silicone rubber layer just after the heating was imperfect, the layer had been cured on the next day. When the printing plate after the development was observed by a loupe, it was found that there was no color contrast between the image area and the non-image area, and observation of halftone dot was impossible.

Comparative Example 2

A waterless CTP planographic printing plate precursor was prepared in the same way as Comparative Example 1, except using <Colored dye-containing diluted silicone liquid> prepared by adding an oil-soluble blue dye: "Oil Blue" 2N (produced by Orient Chemical Industries, Ltd.): 4 wt parts to <Diluted silicone liquid> of Comparative Example 1, and it was evaluated.

Although curing of the colored dye-containing silicone rubber layer just after the heating was imperfect, the layer had been cured on the next day. In a sample after passing one day, silicone rubber was colored well, and dye adsorption to polypropylene film was minor. When the printing plate after the development was observed by a loupe, it was found that there was a sufficient color contrast between the image area and the non-image area, and observation of halftone dot of 1 to 99% was possible. However, the dye in the silicone rubber layer was easily extracted by an ink solvent.

In a sample after passing 7 days, coloring of the silicone rubber layer was mottled, and a significant dye adsorption to the polypropylene film was found. When the printing plate after the development was observed by a loupe, there were portions where color contrast was present and absent between the image area and the non-image area, and there coexisted a portion where halftone dot could be observed and could not be observed.

Example 8

A waterless CTP planographic printing plate precursor was prepared in the same way as Example 7, except changing, of Example 7, <Heat sensitive layer composition liquid-1> to the following described <Heat sensitive layer composition liquid-2>, the heating temperature of heat sensitive layer composition liquid to 135° C., the heating temperature of color pigment-containing diluted silicone liquid to 140° C., and the developing condition to automatic developing machine: TWL-860KII (produced by Toray Industries, Inc.) (pre-treatment portion liquid: NP-1 (produced by Toray Industries, Inc.), development portion liquid: water, post-treatment portion liquid: water), the printing plate transporting speed to 80 cm/min, respectively, and it was evaluated.

<Heat Sensitive Layer Composition Liquid-2>
(a) "Projet" 825LDI: 10 wt parts
(b) "Nacem" titanium: 22 wt parts
(c) "Sumilite Resin" PR50731: 60 wt parts
(d) "Sanprene" (trademark) LQ-T1331D: 50 wt parts
(e) Addition reaction product of m-xylylene diamine/glycidyl methacrylate/3-glycidoxypropyl trimethoxysilane=1/3/1 mol ratio: 15 wt parts
(f) Tetrahydrofuran: 800 wt parts
(g) N,N-Dimethyl formamide: 100 wt parts.

Although curing of the color pigment-containing silicone rubber layer just after the heating was imperfect, the layer had been cured on the next day. Even for a sample after passing 7 days, coloring matter fixing of the silicone rubber layer was good. When the printing plate after the development was observed by a loupe, it was found that there was a sufficient color contrast between the image area and the non-image area, and observation of halftone dot of 1 to 99% was possible.

Comparative Example 3

A waterless CTP planographic printing plate precursor was prepared in the same way as Example 8, except changing to <Diluted silicone liquid> prepared without adding "Fastogen Blue" EP-CFE and "Solsperse" (trademark) 19000 in <Color pigment-containing diluted silicone liquid-4> of Example 8, and it was evaluated.

Although curing of the color pigment-containing silicone rubber layer just after the heating was imperfect, the layer had been cured on the next day. When the printing plate after the development was observed by a loupe, it was found that there was no color contrast between the image area and the non-image area, and observation of halftone dot was impossible.

Example 9

A waterless CTP planographic printing plate precursor was prepared in the same way as Example 7, except changing <Heat sensitive layer composition liquid-1> of Example 7 to the following described <Heat sensitive layer composition liquid-3>, and the irradiation energy of exposure to 350 mJ/cm$^2$, respectively, and it was evaluated.

<Heat Sensitive Layer Composition Liquid-3>
(a) "Projet" 825LDI: 10 wt parts
(b) Nitro cellulose (average degree of polymerization 85, nitrogen content 11.0%, "Bergerac NC", produced by SNPE Japan K.K.): 30 wt parts
(c) "Sanprene" (trademark) LQ-T1331D: 50 wt parts
(d) Epoxy-urea resin: "KP Color" 8704 Clear (produced by Kansai Paint Co.): 20 wt parts
(e) Hydroxyethyl acrylate: 15 wt parts
(f) Methyl ethyl ketone: 700 wt parts.

Although curing of the color pigment-containing silicone rubber layer just after the heating was imperfect, the layer had been cured on the next day. Even for a sample after passing 7 days, coloring matter fixing of the silicone rubber layer was good. When the printing plate after development was visually observed, although the color pigment-containing silicone rubber layer of laser irradiated portion was completely removed, the heat sensitive layer was left. When the printing plate after the development was observed by a loupe, it was found that there was a sufficient color contrast between the image area and the non-image area, and observation of halftone dot of 1 to 99% was possible.

Comparative Example 4

A waterless CTP planographic printing plate precursor was prepared in the same way as Example 9, except changing to <Diluted silicone liquid> prepared without adding "Fastogen Blue" EP-CFE and "Solsperse" (trademark) 19000 in <Color pigment-containing diluted silicone liquid-4> of Example 9, and it, was evaluated.

Although curing of the color pigment-containing silicone rubber layer just after the heating was imperfect, the layer had, been cured on the next day. When the printing plate after the development was observed by a loupe, it was found that there was no color contrast between the image area and the non-image area, and observation of halftone dot was impossible.

Example 10

A waterless CTP planographic printing plate precursor was prepared in the same way as Example 9, except changing the heat sensitive layer of Example 9 to a zinc thin film of 25 nm provided by a vacuum vapor deposition, and it was evaluated.

Although curing of the color pigment-containing silicone rubber layer just after the heating was imperfect, the layer had been cured on the next day. Even for a sample after passing 7 days, coloring matter fixing of the silicone rubber layer was good. When the printing plate after development was visually observed, although the color pigment-containing silicone rubber layer of laser irradiated portion was completely removed, the heat sensitive layer was left. When the printing plate after the development was observed by a loupe, it was found that there was a sufficient color contrast between the image area and the non-image area, and observation of halftone dot of 1 to 99% was possible.

Comparative Example 5

A waterless CTP planographic printing plate precursor was prepared in the same way as Example 10, except changing to <Diluted silicone liquid> prepared without adding "Fastogen Blue" EP-CFE and "Solsperse" (trademark) 19000 in <Color pigment-containing diluted silicone liquid-4> of Example 10, and it was evaluated.

Although curing of the color pigment-containing silicone rubber layer just after the heating was imperfect, the layer had been cured on the next day. When the printing plate after the development was observed by a loupe, it was found that there was no color contrast between the image area and the non-image area, and observation of halftone dot was impossible.

Example 11

A waterless CTP planographic printing plate precursor was prepared in the same way as Example 7, except changing <Heat sensitive layer composition liquid-1> of Example 7 to the following described <Heat sensitive layer composition liquid-4>, the heating temperature of heat sensitive layer composition liquid to 80° C., the film thickness of heat sensitive layer to 2.5 g/m$^2$, the heating temperature of color pigment-containing diluted silicone liquid to 140° C., the irradiation energy of exposure to 250 mJ/cm$^2$, and the development condition to automatic developing machine: TWL-860KII (produced by Toray Industries, Inc.) (pre-treatment portion liquid: PP-F (produced by Toray Industries, Inc.), development portion liquid: water, post-treatment portion liquid: water), and the printing plate transporting speed to 80 cm/min, respectively, and it was evaluated.

<Heat Sensitive Layer Composition Liquid-4>
(a) "Projet" 825LDI: 10 wt parts
(b) "Nacem" titanium: 15 wt parts
(c) Addition reaction product of pentaoxypropylene diamine/glycidyl methacrylate/methyl glycidyl ether=1/3/1 mol ratio: 15 wt parts
(d) Addition reaction product of m-xylylene diamine/glycidyl methacrylate/methyl glycidyl ether=1/2/2 mol ratio: 15 wt parts
(e) Addition reaction product of m-xylylene diamine/glycidyl methacrylate/3-glycidoxypropyl trimethoxysilane=1/3/1 mol ratio: 3 wt parts
(f) Pentaerythritol polyglycidyl ether: "Deconal" EX-411 (produced by Nagase Chemicals Ltd.): 5 wt parts
(g) "Sanprene" (trademark) LQ-T1331D: 45 wt parts
(h) Maleic acid: 0.5 wt parts
(i) Tetrahydrofuran: 200 wt parts
(j) N,N-Dimethyl formamide: 50 wt parts.

Although curing of the color pigment-containing silicone rubber layer just after the heating was imperfect, the layer had been cured on the next day. Even for a sample after passing 7 days, coloring matter fixing of the silicone rubber layer was good. When the printing plate after the development was observed by a loupe, it was found that there was a sufficient color contrast between the image area and the non-image area, and observation of halftone dot of 1 to 99% was possible.

Comparative Example 6

A waterless CTP planographic printing plate precursor was prepared in the same way as Example 11, except changing to <Diluted silicone liquid> prepared without adding "Fastogen Blue" EP-CFE and "Solsperse" (trademark) 19000 in <Color pigment-containing diluted silicone liquid-4> of Example 11, and it was evaluated.

Although curing of the color pigment-containing silicone rubber layer just after the heating was imperfect, the layer had been cured on the next day. When the printing plate after the development was observed by a loupe, it was found that there was no color contrast between the image area and the non-image area, and observation of halftone dot was impossible.

Example 12

A waterless CTP planographic printing plate precursor was prepared in the same way as Example 7, except changing <Heat sensitive layer composition liquid-1> of Example 7 to the following described <Photosensitive layer composition liquid-1>, the heating temperature of photosensitive layer composition liquid to 80° C., the heating temperature of color pigment-containing diluted silicone liquid to 140° C., the exposure condition to exposure machine: "Idolfin" ID-2000 (produced by Orc Manufacturing Co.) and an exposure amount: at 11 mW/cm$^2$ (365 nm light) for 60 seconds exposure via a negative image film (halftone dot of 1 to 99% (175 lpi)), and the development condition to an automatic developing machine: TWL-860KII (produced by Toray Industries, Inc.) (pre-treatment portion liquid: NP-1 (produced by Toray Industries, Inc.), development portion liquid: water, post-treatment portion liquid: water), and the printing plate transporting speed to 60 cm/min, respectively, and it was evaluated.
<Photosensitive Layer Composition Liquid-1>
- (a) 1,2-Naphthoquinone-2-diazido-5-sulfonic acid chloride and a partially esterified product of "Sumilite Resin" PR50731 <degree of esterification 36%>: 100 wt parts
- (b) "Sanprene" (trademark) LQ-T1331D: 50 wt parts
- (c) 4,4'-Bis(diethylamino)benzophenone: 10 wt parts
- (d) Polyisocyanate: "Millionate" MR200: 20 wt parts
- (d) Dibutyl tin diacetate: 0.2 wt parts
- (e) Acetic acid: 2 wt parts
- (f) Tetrahydrofuran: 800 wt parts.

Although curing of the color pigment-containing silicone rubber layer just after the heating was imperfect, the layer had been cured on the next day. Even for a sample after passing 7 days, coloring matter fixing of the silicone rubber layer was good. When the printing plate after the development was observed by a loupe, it was found that there was a sufficient color contrast between the image area and the non-image area, and observation of halftone dot of 1 to 99% was possible:

Comparative Example 7

A waterless CTP planographic printing plate precursor was prepared in the same way as Example 12, except changing to <Diluted silicone liquid> prepared without adding "Fastogen Blue" EP-CFE and "Solsperse" (trademark) 19000 in <Color pigment-containing diluted silicone liquid-4> of Example 12, and it was evaluated.

Although curing of the color pigment-containing silicone rubber layer just after the heating was imperfect, the layer had been cured on the next day. When the printing plate after the development was observed by a loupe, it was found that there was not a sufficient color contrast between the image area and the non-image area, and observation of halftone dot was impossible.

Example 13

A waterless CTP planographic printing plate precursor was prepared in the same way as Example 7, except changing <Heat sensitive layer composition liquid-1> of Example 7 to the following described <Photosensitive layer composition liquid-2>, the heating temperature of photosensitive layer composition liquid to 100° C., the film thickness of photosensitive layer to 4 g/m$^2$, the heating temperature of color pigment-containing diluted silicone liquid to 120° C., the protective film to a polyethylene terephthalate film: "Lumirror" (produced by Toray Industries, Inc.) of 6 μm thickness, the exposure condition to exposure machine: "Idolfin" ID-2000 (produced by Orc Manufacturing Co.) and an exposure amount: at 11 mW/cm$^2$ (365 nm light) for 60 seconds exposure via a positive image film (halftone dot of 1 to 99% (175 lpi)), and the development condition to an automatic developing machine: TWL-860KII (produced by Toray Industries, Inc.) (pre-treatment portion liquid: PP-F (produced by Toray Industries, Inc.), development portion liquid: water, post-treatment portion liquid: water), and the printing plate transporting speed to 80 cm/min, respectively, and it was evaluated.
<Photosensitive layer composition liquid-2>
- (a) "Sanprene" (trademark) LQ-T1331D: 335 wt parts
- (b) Reaction product of m-xylylene diamine 1 mol and glycidyl methacrylate 4 mol: 10 wt parts
- (c) Reaction product of polyoxypropylene diamine 1 mol and glycidyl methacrylate 4 mol: 10 wt parts
- (d) Difunctional methacrylate: "Light-Ester" 1☐10DC (produced by Kyoeisha Chemical Co.): 8 wt parts
- (e) Reaction product of polyoxypropylene diamine/glycidyl methacrylate/3-glycidoxypropyl trimethoxysilane=1/3/1 mol: 2 wt parts
- (f) Tri(butoxycarbonyl methyl)trithiophosphite: 2 wt parts
- (g) Hindered phenol-based anti-oxidant: "Plastanox" 1729 (American Cyanamid Co.): 1 wt parts
- (h) 4,4'-Bis(diethylamino)benzophenone: 2 wt parts
- (i) 10-n-Butyl-2-chloroacrydoneacridone: 4 wt parts
- (j) 2,4-Diethyl thioxanthone: 7 wt parts
- (k) Dye "Aizen Victoria Pure Blue"-BOH conc. (produced by Hodogaya Chemical Co.): 0.1 wt parts
- (l) Surface active agent "Fluorad" FC470 (produced by Sumitomo 3M Ltd.): 0.03 wt parts
- (m) 2-Ethyl anthraquinone: 0.02 wt parts
- (n) Ethyl cellosolve: 150 wt parts
- (o) Methyl ethyl ketone: 400 wt parts
- (p) Tetrahydrofuran: 200 wt parts.

Although curing of the color pigment-containing silicone rubber layer just after the heating was imperfect, the layer had been cured on the next day. Even for a sample after passing 7 days, coloring matter fixing of the silicone rubber layer was good. When the printing plate after the development was observed by a loupe, it was found that there was a sufficient color contrast between the image area and the non-image area, and observation of halftone dot of 1 to 99% was possible.

Comparative Example 8

A waterless CTP planographic printing plate precursor was prepared in the same way as Example 13, except changing to <Diluted silicone liquid> prepared without adding "Fastogen Blue" EP-CFE and "Solsperse" (trademark) 19000 in <Color pigment-containing diluted silicone liquid-4> of Example 13, and it was evaluated.

Although curing of the color pigment-containing silicone rubber layer just after the heating was imperfect, the layer had been cured on the next day. When the printing plate after the development was observed by a loupe, it was found that there was not a sufficient color contrast between the image area and the non-image area, and observation of halftone dot was impossible.

The above results are summarized in Tables 1 to 4.

TABLE 1

| No. | Kind of Photo (heat) sensitive layer | Kind of Silicone Liquid | Coloring matter | Pigment Dispersant |
| --- | --- | --- | --- | --- |
| Example 1 | Heat sensitive layer 1 | Color pigment-containing silicone liquid 1 | 1 | none |
| Example 2 | Heat sensitive layer 1 | Color pigment-containing silicone liquid 2 | 2 | none |
| Example 3 | Heat sensitive layer 1 | Color pigment-containing silicone liquid 3 | 3 | none |
| Example 4 | Heat sensitive layer 1 | Color pigment-containing diluted silicone liquid 1 | 3 | none |
| Example 5 | Heat sensitive layer 1 | Color pigment-containing diluted silicone liquid 2 | 3 | 1 |

TABLE 1-continued

| No. | Kind of Photo (heat) sensitive layer | Kind of Silicone Liquid | Coloring matter | Pigment Dispersant |
|---|---|---|---|---|
| Example 6 | Heat sensitive layer 1 | Color pigment-containing diluted silicone liquid 3 | 3 | 2 |
| Example 7 | Heat sensitive layer 1 | Color pigment-containing diluted silicone liquid 4 | 3 | 2 |
| Comp. Example 1 | Heat sensitive layer 1 | Diluted silicone liquid | none | none |
| Comp. Example 2 | Heat sensitive layer 1 | Color pigment-containing diluted silicone liquid | 4 | none |

Pigment:
1. Pigment "Chromofine Red" 6605
2. Pigment Milori Blue N650
3. Pigment "Fastogen Blue" EP-CFE
4. Pigment "Oil Blue" 2N Pigment dispersant:
1. "Plenact" KR-TTS
2. "Solspers" 19000

TABLE 2

| No. | Kind of Photo (heat) sensitive layer | Kind of Silicone Liquid | Coloring matter | Pigment Dispersant |
|---|---|---|---|---|
| Example 8 | Heat sensitive layer 2 | Color pigment-containing diluted silicone liquid 4 | 3 | 2 |
| Comp. Example 3 | Heat sensitive layer 2 | Diluted silicone liquid | none | none |
| Example 9 | Heat sensitive layer 3 | Color pigment-containing diluted silicone liquid 4 | 3 | 2 |
| Comp. Example 4 | Heat sensitive layer 3 | Diluted silicone liquid | none | none |
| Example 10 | Heat sensitive layer 4 | Color pigment-containing diluted silicone liquid 4 | 3 | 2 |
| Comp. Example 5 | Heat sensitive layer 4 | Diluted silicone liquid | none | none |
| Example 11 | Heat sensitive layer 5 | Color pigment-containing diluted silicone liquid 4 | 3 | 2 |
| Comp. Example 6 | Heat sensitive layer 5 | Diluted silicone liquid | none | none |
| Example 12 | Photo sensitive layer 1 | Color pigment-containing diluted silicone liquid 4 | 3 | 2 |
| Comp. Example 7 | Photo sensitive layer 1 | Diluted silicone liquid | none | none |
| Example 13 | Photo sensitive layer 2 | Color pigment-containing diluted silicone liquid 4 | 3 | 2 |
| Comp. Example 8 | Photo sensitive layer 2 | Diluted silicone liquid | none | none |

Pigment:
1. Pigment "Chromofine Red" 6605
2. Pigment Milori Blue N650
3. Pigment "Fastogen Blue" EP-CFE
4. Pigment "Oil Blue" 2N Pigment dispersant:
1. "Plenact" KR-TTS
2. "Solspers" 19000

TABLE 3

| | 1 day after preparation | | | 7 days after preparation | | |
|---|---|---|---|---|---|---|
| | Fixation of coloring matter | | Visual inspectability of printing plate | Fixation of coloring matter | | Visual inspectability of printing plate |
| No. | (A) | (B) | | (A) | (B) | |
| Example 1 | ○○ | ○○ | ○○ | ○○ | ○○ | ○○ |
| Example 2 | ○○ | ○○ | ○○ | ○○ | ○○ | ○○ |
| Example 3 | ○○ | ○○ | ○○ | ○○ | ○○ | ○○ |
| Example 4 | ○○ | ○○ | ○ | ○○ | ○○ | ○ |
| Example 5 | ○○ | ○○ | ○○ | ○○ | ○○ | ○○ |
| Example 6 | ○○ | ○○ | ○○ | ○○ | ○○ | ○○ |
| Example 7 | ○○ | ○○ | ○○ | ○○ | ○○ | ○○ |
| Comp. Example 1 | — | — | x | — | — | x |
| Comp. Example 2 | ○ | x | ○○ | x | x | x |

TABLE 4

| | 1 day after preparation | | | 7 days after preparation | | |
|---|---|---|---|---|---|---|
| | Fixation of coloring matter | | Visual inspectability of printing plate | Fixing property of coloring matter | | Visual inspectability of printing plate |
| No. | (A) | (B) | | (A) | (B) | |
| Example 8 | ○○ | ○○ | ○○ | ○○ | ○○ | ○○ |
| Comp. Example 3 | — | — | x | — | — | x |
| Example 9 | ○○ | ○○ | ○○ | ○○ | ○○ | ○○ |

TABLE 4-continued

|  | 1 day after preparation | | | 7 days after preparation | | |
| --- | --- | --- | --- | --- | --- | --- |
|  | Fixation of coloring matter | | Visual inspectability | Fixing property of coloring matter | | Visual inspectability |
| No. | (A) | (B) | of printing plate | (A) | (B) | of printing plate |
| Comp. Example 4 | — | — | x | — | — | x |
| Example 10 | ∘∘ | ∘∘ | ∘∘ | ∘∘ | ∘∘ | ∘∘ |
| Comp. Example 5 | — | — | x | — | — | x |
| Example 11 | ∘∘ | ∘∘ | ∘∘ | ∘∘ | ∘∘ | ∘∘ |
| Comp. Example 6 | — | — | x | — | — | x |
| Example 12 | ∘∘ | ∘∘ | ∘∘ | ∘∘ | ∘∘ | ∘∘ |
| Comp. Example 7 | — | — | x | — | — | x |
| Example 13 | ∘∘ | ∘∘ | ∘∘ | ∘∘ | ∘∘ | ∘∘ |
| Comp. Example 8 | — | — | x | — | — | x |

Example 14

A waterless CTP planographic printing plate precursor was prepared in the same way as Example 5, except changing <Color pigment-containing diluted silicone liquid-2> of Example 5 to the following <Color pigment-containing diluted silicone liquid-5>, and it was evaluated. However, it was evaluated by using, as the milori blue-containing silicone paste, 2 kinds of (i) a paste just after-dispersing, (ii) a paste after passing 6 months, at room temperature.

<Color Pigment-Containing Diluted Silicone Liquid-5>

A milori blue-containing silicone paste was obtained by dispersing and mixing the following described (a) to (c) by a three roll mill. While the obtained color pigment-containing silicone paste was stirred, the (d) was added to dilute, and next, it was bubbled with dried nitrogen gas for 20 minutes. While the obtained liquid was stirred, the (e) to (g) were added, and the mixture was well stirred until it became uniform. The obtained milori blue-containing diluted silicone liquid was subjected to a defoamation under atmospheric pressure.

(a) "DMS" V52: 83 wt parts
(b) N650 Milori Blue: 4 wt parts
(c) "Plenact" (trademark) KR-TTS: 1.5 wt parts
(d) "Isopar" (trademark) E: 900 wt parts
(e) "HMS" 991: 4 wt parts
(f) vinyl tris(methyl ethyl ketoximino) silane: 3 wt parts.
(g) "SRX" 212: 6 wt parts.

(i) Paste Just After Dispersing

<Milori Blue Particle Diameter in Paste just after Dispersing>

When milori blue particle diameter in the liquid prepared by diluting the milori blue-containing silicone paste 100 times with "Isopar" (trademark) E was measured by Laser Diffraction/Scattering Particle Size Distribution Analyzer "LA" 920 (produced by Horiba, Ltd.), it was found to be 0.43 μm (median diameter), and an aggregation of the milori blue particle by the solvent dilution was found.

<Printing Plate Properties>

Coatability of the milori blue-containing diluted silicone liquid was good. The color pigment-containing silicone rubber layer just after the heating had been completely cured. Even for a sample after passing 7 days, coloring matter fixing of the silicone rubber layer was good. When the printing plate after the development was observed by a loupe, it was found that there was a sufficient color contrast between the image area and the non-image area, and observation of halftone dot of 2 to 98% was possible.

(ii) Paste after Passing 6 Months at Room Temperature

<Milori Blue Particle Diameter in Paste after Passing 6 Months at Room Temperatures>

To the milori blue-containing silicone paste after passing 6 months at room temperature, glass beads (diameter 2 mm) were put and stirred for one hour by using, Variable Mix Rotor "VMR" 5 (produced by As One Corp.) at 100 rpm. When particle diameter of milori blue after the stirring in the liquid prepared by diluting the milori blue-containing silicone paste 100 times with "Isopar" (trademark) E was measured, it was found to be 0.90 μm (median diameter), and re-dispersibility was not good.

<Printing Plate Properties>

Coatability of the color pigment-containing diluted silicone liquid was good. The color pigment-containing silicone rubber layer just after the heating had been completely cured. Even for a sample after passing 7 days, coloring matter fixing of the silicone rubber layer was good. When the printing plate after the development was observed by a loupe, there was a color contrast between the image area and the non-image area, and observation of halftone dot of 3 to 97% was possible.

Example 15

A waterless CTP planographic printing plate precursor was prepared in the same way as Example 14, except changing <Color pigment-containing diluted silicone liquid-5> of Example 14 to the following <Color pigment-containing diluted silicone liquid-6>, and it was evaluated.

<Color Pigment-Containing Diluted Silicone Liquid-6>

By dispersing the following described (a) to (c) by a beads mill "Star Mill" Minitsuea (produced by Ashizawa Finetech Ltd.) filled with zirconia beads (diameter 0.3 mm), a milori blue dispersion was obtained. On the other hand, by mixing the (d) to (h), a diluted silicone liquid was obtained. While stirring the milori blue dispersion, the diluted silicone liquid was added and stirred well, until the mixture became uniform. The obtained color pigment-containing diluted silicone liquid was subjected to a defoamation under atmospheric pressure.

(a) N650 Milori Blue: 4 wt parts
(b) "Plenact" (trademark) KR-US: 1.5 wt parts
(c) "Isopar" (trademark) E: 83 wt parts
(d) "DMS" V52: 83 wt parts
(e) "HMS" 991: 4 wt parts
(f) Vinyl tris(methyl ethyl ketoximino) silane: 3 wt parts
(g) "SRX" 212: 6 wt parts.
(h) "Isopar" (trademark) E: 817 wt parts.

(i) Dispersion Just after Dispersing

<Milori Blue Particle Diameter in Dispersion Just after Dispersing>

When particle diameter of milori blue in the liquid in which milori blue dispersion was diluted 100 times with "Isopar" (trademark) E was measured, it was found to be 0.17 μm (median diameter), and an aggregation of milori blue particle by the solvent dilution was not found.

<Printing Plate Properties>

Coatability of the milori blue-containing diluted silicone liquid was good. The color pigment-containing silicone rubber layer just after the heating had been completely cured. Even for a sample after passing 7 days, coloring matter fixing of the silicone rubber layer was good. When the printing plate after the development was observed by a loupe, it was found that there was a sufficient color contrast between the image area and the non-image area, and observation of halftone dot of 1 to 99% was possible.

(ii) Dispersion after Passing 6 Months at Room Temperature

<Milori Blue Particle Diameter in Dispersion after Passing 6 Months at Room Temperature>

To the milori blue dispersion after passing 6 months at, room temperature, glass beads (diameter 2 mm) were put and stirred for one hour by using "VMR"-5 at 100 rpm. When particle diameter of milori blue after the stirring in the liquid prepared by diluting the milori blue dispersion 100 times with "Isopar" (trademark) E, it was found to be 0.18 μm (median diameter), and the re-dispersibility was good.

<Printing Plate Properties>

Coatability of the color pigment-containing diluted silicone liquid was good. The color pigment-containing silicone rubber layer just after the heating had been completely cured. Even for a sample after passing 7 days, coloring matter fixing of the silicone rubber layer was good. When the printing plate after the development was observed by a loupe, it was found that there was a sufficient color contrast between the image area and the non-image area, and observation of halftone dot of 1 to 99% was possible.

The above are summarized in Table 5.

TABLE 5

| | | | Use of dispersion just after dispersing | | | | Use of dispersion after 6 months at room temperature | | | |
| | | | | Performance of printing plate | | | | Performance of printing plate | | |
| No. | Kind of dispersion | Coatability | Particle diameter (μm) | Fixation of coloring matter (A) | (B) | Visual inspectability of printing plate | Particle diameter (μm) | Fixation of coloring matter (A) | (B) | Visual inspectability of printing plate |
|---|---|---|---|---|---|---|---|---|---|---|
| Example 14 | 1 | Good | 0.43 | ○○ | ○○ | ○○ | 0.90 | ○○ | ○○ | ○ |
| Example 15 | 2 | Good | 0.17 | ○○ | ○○ | ○○ | 0.18 | ○○ | ○○ | ○○ |

Kind of dispersion:
1. Minoli blue-containing silicone paste
2. Minoli blue dispersion Furthermore, for the waterless planographic printing plate obtained by exposure and development of the waterless planographic printing plate precursors (those after passing 7 days) of each example and comparative example, a reflection density measurement and a tone value measurement were carried out by the above-mentioned methods. Results are summarized in Tables 6 to 9.

TABLE 6

| | | Reflection density | | |
|---|---|---|---|---|
| No. | Measurement | Image area | Non-image area | Difference of concentration |
| Example 1 | Magenta | 0.47 | 0.87 | 0.40 |
| Example 2 | Cyan | 0.93 | 1.25 | 0.32 |
| Example 3 | Cyan | 0.93 | 1.33 | 0.40 |
| Example 4 | Cyan | 0.93 | 1.16 | 0.23 |
| Example 5 | Cyan | 0.93 | 1.41 | 0.48 |
| Example 6 | Cyan | 0.93 | 1.44 | 0.51 |
| Example 7 | Cyan | 0.93 | 1.43 | 0.50 |
| Comp. Example 1 | Cyan | 0.93 | 0.96 | 0.03 |
| Comp. Example 2 | Cyan | 0.93 | 0.99 | 0.06 |

TABLE 7

| No. | Measurement | Reflection density Image area | Reflection density Non-image area | Difference of concentration |
|---|---|---|---|---|
| Example 8 | Cyan | 0.84 | 1.35 | 0.51 |
| Comp. Example 3 | Cyan | 0.84 | 0.85 | 0.01 |
| Example 9 | Cyan | 0.99 | 1.48 | 0.49 |
| Comp. Example 4 | Cyan | 0.99 | 1.00 | 0.01 |
| Example 10 | Cyan | 0.81 | 1.33 | 0.52 |
| Comp. Example 5 | Cyan | 0.78 | 0.81 | 0.03 |
| Example 11 | Cyan | 1.17 | 1.62 | 0.45 |
| Comp. Example 6 | Cyan | 1.17 | 1.17 | 0 |
| Example 12 | Cyan | 0.27 | 0.81 | 0.54 |
| Comp. Example 7 | Cyan | 0.27 | 0.29 | 0.02 |
| Example 13 | Cyan | 0.51 | 0.90 | 0.39 |
| Comp. Example 8 | Cyan | 0.51 | 0.37 | 0.14 |
| Example 14 Use of dispersion just after dispersing | Cyan | 0.93 | 1.32 | 0.39 |
| Use of dispersion after 6 months under room temp. | Cyan | 0.93 | 1.18 | 0.25 |
| Example 15 Use of dispersion just after dispersing | Cyan | 0.93 | 1.43 | 0.50 |
| Use of dispersion after 6 months under room temp. | Cyan | 0.93 | 1.41 | 0.48 |

TABLE 8

| No. | Measurement | Tone value 5% | 20% | 35% | 50% | 65% | 80% | 95% | Decision |
|---|---|---|---|---|---|---|---|---|---|
| Example 1 | Magenta | 5% | 20% | 35% | 50% | 65% | 80% | 95% | ○○ |
| Example 2 | Cyan | 5% | 20% | 35% | 50% | 65% | 80% | 95% | ○○ |
| Example 3 | Cyan | 5% | 20% | 35% | 50% | 65% | 80% | 95% | ○○ |
| Example 4 | Cyan | 5% | 20% | 35% | (52%) | (69%) | (84%) | (100%) | ○ |
| Example 5 | Cyan | 5% | 20% | 35% | 50% | 65% | 80% | 95% | ○○ |
| Example 6 | Cyan | 5% | 20% | 35% | 50% | 65% | 80% | 95% | ○○ |
| Example 7 | Cyan | 5% | 20% | 35% | 50% | 65% | 80% | 95% | ○○ |
| Comp. Example 1 | Cyan | (any of halftone dots was 0% or 100%) | | | | | | | x |
| Comp. Example 2 | Cyan | (any of halftone dots was 0% or 100%) | | | | | | | x |

In Table, ( ) is a portion where tone value measurement was unsuccessful.

TABLE 9

| No. | Measurement | Tone value 5% | 20% | 35% | 50% | 65% | 80% | 95% | Decision |
|---|---|---|---|---|---|---|---|---|---|
| Example 8 | Cyan | 5% | 20% | 35% | 50% | 65% | 80% | 95% | ○○ |
| Comp. Example 3 | Cyan | (any of halftone dots was 0% or 100%) | | | | | | | x |
| Example 9 | Cyan | 5% | 20% | 35% | 50% | 65% | 80% | 95% | ○○ |
| Comp. Example 4 | Cyan | (any of halftone dots was 0% or 100%) | | | | | | | x |
| Example 10 | Cyan | 5% | 20% | 35% | 50% | 65% | 80% | 95% | ○○ |
| Comp. Example 5 | Cyan | (any of halftone dots was 0% or 100%) | | | | | | | x |
| Example 11 | Cyan | 5% | 20% | 35% | 50% | 65% | 80% | 95% | ○○ |
| Comp. Example 6 | Cyan | (any of halftone dots was 0% or 100%) | | | | | | | x |
| Example 12 | Cyan | 5% | 20% | 35% | 50% | 65% | 80% | 95% | ○○ |
| Comp. Example 7 | Cyan | (any of halftone dots was 0% or 100%) | | | | | | | x |
| Example 13 | Cyan | 5% | 20% | 35% | 50% | 65% | 80% | 95% | ○○ |
| Comp. Example 8 | Cyan | (22%) | (41%) | (53%) | (72%) | (88%) | (100%) | (100%) | x |
| Example 14 Use of dispersion just after dispersing | Cyan | 5% | 20% | 35% | 50% | 65% | 80% | 95% | ○○ |
| Use of dispersion after 6 months under room temp. | Cyan | 5% | 20% | 35% | 50% | 65% | (82%) | (98%) | ○ |
| Example 15 Use of dispersion just after dispersing | Cyan | 5% | 20% | 35% | 50% | 65% | 80% | 95% | ○○ |
| Use of dispersion after 6 months under room temp. | Cyan | 5% | 20% | 35% | 50% | 65% | 80% | 95% | ○○ |

In Table, ( ) is a portion where tone value measurement was unsuccessful.

Examples 16 to 22

A waterless CTP planographic printing plate precursors were prepared in the same way as Example 15, except changing the color pigment used: in <Color pigment-containing diluted silicone liquid-6> to the following color pigments, and they were evaluated (in each example, as color pigment dispersion, color pigment dispersions just after dispersing were used).

Kinds of Color Pigment Used
- (Example 16) Disazo Yellow AAA: "Seika Fast Yellow" 2300 (produced by Dainichiseika Color & Chemicals Mfg. Co.)
- (Example 17) Brilliant carmine 6B: "Seika Fast Carmine" 1476T-7 (produced by Dainichiseika Color & Chemicals Mfg. Co.
- (Example 18) Phthalocyanine Blue: "Fastogen Blue" EP-CFE (produced by Dainippon Ink & Chemicals, Inc.
- (Example 19) Milori blue: N650 Milori Blue (produced by Dainichiseika Color & Chemicals Mfg. Co.)
- (Example 20) Ultramarine: Nubiflow (produced by Ozeki Co.)
- (Example 21) Complex oxide-based pigment: "Dipyroxide™ Blue" #3410 (produced by Dainichiseika Color & Chemicals Mfg. Co.)
- (Example 22) Ferric oxide: "TAROX" R-110-7 (produced by Titan Kogyo, Ltd.)

Results are summarized in Table 10.

TABLE 10

| | Color pigment used | | | Use of diluted silicone liquid containing color pigment just after preparation | | | | Use of diluted silicone liquid containing color pigment 1 day after preparation | | | |
|---|---|---|---|---|---|---|---|---|---|---|---|
| | | | | Reflection density | | | Visual | Reflection density | | | Visual |
| NO. | Kind | Density (g/cm³) | Measurement | Image area | Non-image area | Difference of concentration | inspectability of printing plate | Image area | Non-image area | Difference of oncentration | inspectability of printing plate |
| Example 16 | 1 | 1.4 | Yellow | 1.50 | 1.78 | 0.28 | ○ | 1.50 | 1.74 | 0.24 | ○ |
| Example 17 | 2 | 1.6 | Magenta | 0.47 | 1.01 | 0.54 | ○○ | 0.47 | 0.99 | 0.52 | ○○ |
| Example 18 | 3 | 1.6 | Cyan | 0.93 | 1.55 | 0.62 | ○○ | 0.93 | 1.50 | 0.57 | ○○ |
| Example 19 | 4 | 1.8 | Cyan | 0.93 | 1.43 | 0.50 | ○○ | 0.93 | 1.40 | 0.47 | ○○ |
| Example 20 | 5 | 2.5 | Cyan | 0.93 | 1.30 | 0.37 | ○○ | 0.93 | 1.24 | 0.31 | ○○ |
| Example 21 | 6 | 4.5 | Cyan | 0.93 | 1.20 | 0.27 | ○ | 0.93 | 0.97 | 0.04 | x |
| Example 22 | 7 | 5.2 | Magenta | 0.47 | 0.72 | 0.25 | ○ | 0.47 | 0.50 | 0.03 | x |

Kind of color pigment used

1 "Seika Fast Yellow" 2300

2 "Seika Fast Carmine" 1476T-7

3 "Fastogen Blue" EP-CFE

4 Milori Blue N650

5 Nubiflow

6 "Dipyroxide TM Blue" #3410

7 "Talox" R-110-7

The invention claimed is:

1. A waterless planographic printing plate precursor having, on a substrate, at least a photosensitive layer or heat sensitive layer and a silicone rubber layer, which is a waterless planographic printing plate precursor characterized in that a color pigment and a pigment dispersant are contained in said silicone rubber layer, wherein said pigment dispersant contains an amine-based pigment dispersant as described in formulae (3):

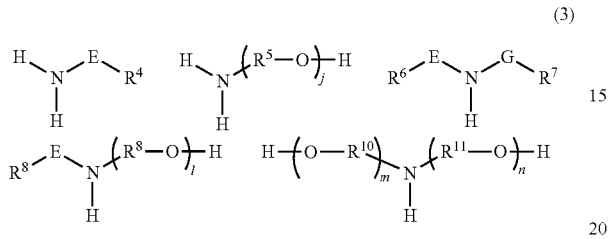

wherein $R^4$ is a saturated or unsaturated hydrocarbon group, and may be linear, branched or cyclic, and may contain an aromatic ring; $R^5$ is a saturated or unsaturated divalent hydrocarbon group of carbon number of 3 or more, and may be linear, branched or cyclic; j is a number of repetitions and an integer of 1 or more; $R^6$ and $R^7$ are saturated or unsaturated hydrocarbon groups and may be linear, branched or cyclic, and may contain an aromatic ring; $R^8$ is a saturated or unsaturated hydrocarbon group of a carbon number of 1 or more and may be linear, branched or cyclic, and may contain an aromatic ring; $R^9$ is a saturated or unsaturated divalent hydrocarbon group of carbon number of 3 or more and may be linear, branched or cyclic; 1 is a number of repetitions and an integer of 1 or more; $R^{10}$ and $R^{11}$ are saturated or unsaturated divalent hydrocarbon groups of carbon number of 3 or more and may be linear, branched or cyclic, and both of $R^{10}$ and $R^{11}$ may be the same or different, respectively; each of m and n are a number of repetitions and an integer of 1 or more, respectively; and E and G are divalent groups expressed in any one of formulae (4), and may be the same or different, respectively:

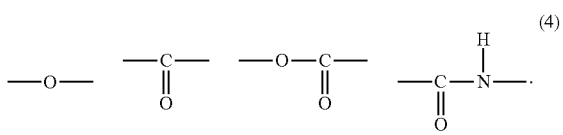

2. The waterless planographic printing plate precursor according to claim 1, wherein said color pigment contains milori blue.

* * * * *